(12) United States Patent
Liaw

(10) Patent No.: US 11,575,050 B2
(45) Date of Patent: Feb. 7, 2023

(54) SEMICONDUCTOR STRUCTURE HAVING BOTH GATE-ALL-AROUND DEVICES AND PLANAR DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 129 days.

(21) Appl. No.: 17/222,011

(22) Filed: Apr. 5, 2021

(65) Prior Publication Data

US 2021/0226070 A1    Jul. 22, 2021

Related U.S. Application Data

(62) Division of application No. 16/393,166, filed on Apr. 24, 2019, now Pat. No. 10,971,630.

(51) Int. Cl.
| | |
|---|---|
| H01L 29/66 | (2006.01) |
| H01L 29/786 | (2006.01) |
| H01L 29/423 | (2006.01) |
| H01L 21/8238 | (2006.01) |
| H01L 27/092 | (2006.01) |
| H01L 29/775 | (2006.01) |

(52) U.S. Cl.
CPC ............ *H01L 29/78696* (2013.01); *H01L 21/823807* (2013.01); *H01L 21/823857* (2013.01); *H01L 27/092* (2013.01); *H01L 29/42392* (2013.01); *H01L 29/775* (2013.01)

(58) Field of Classification Search
CPC ............ H01L 29/78696; H01L 27/092; H01L 29/42392; H01L 29/775
See application file for complete search history.

(56) References Cited

U.S. PATENT DOCUMENTS

| | | | |
|---|---|---|---|
| 7,719,058 | B2 | 5/2010 | Seliskar |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,490,559 | B1 | 11/2019 | Ando |
| 2017/0309706 | A1 | 10/2017 | Cheng et al. |
| 2018/0102359 | A1 | 4/2018 | Cheng et al. |
| 2018/0158908 | A1 | 6/2018 | Yang et al. |
| 2019/0058036 | A1 | 2/2019 | Smith et al. |

*Primary Examiner* — Samuel A Gebremariam
(74) *Attorney, Agent, or Firm* — Haynes and Boone, LLP

(57) ABSTRACT

An integrated circuit includes gate-all-around (GAA) nanowire transistors, GAA nanosheet transistors, and planar devices on the same substrate. Gate dielectric layers of the GAA nanowire transistors and the GAA nanosheet transistors have substantially the same thickness which is smaller than the thickness of the gate dielectric layer of the planar devices. The channel width of the planar devices is greater than the channel width of the GAA nanosheet transistors, which is greater than the channel width of the GAA nanowire transistors.

20 Claims, 19 Drawing Sheets

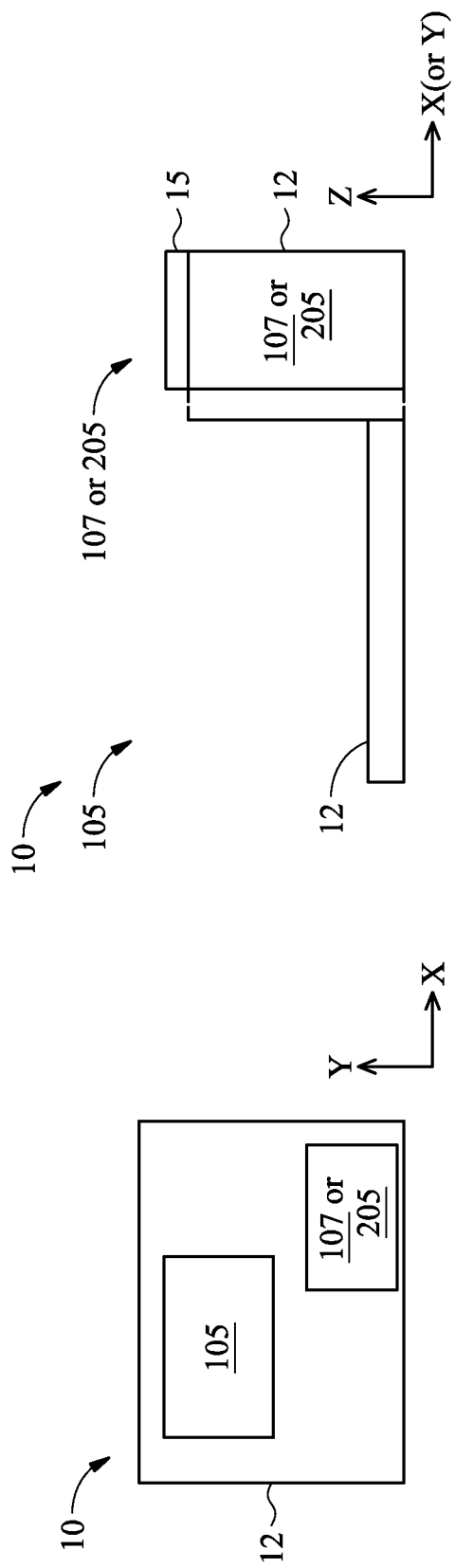
FIG. 16A
FIG. 16B
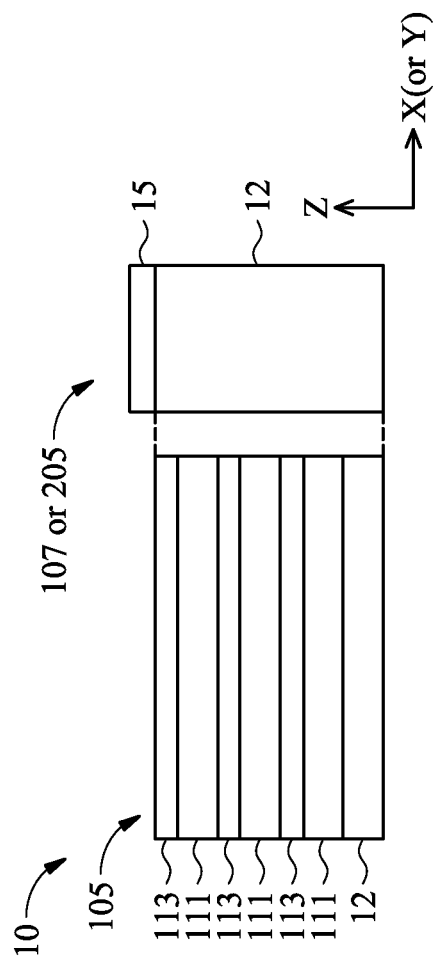
FIG. 16C

SEMICONDUCTOR STRUCTURE HAVING BOTH GATE-ALL-AROUND DEVICES AND PLANAR DEVICES

PRIORITY

This application is a divisional of U.S. application Ser. No. 16/393,166 filed Apr. 24, 2019, now issued U.S. Pat. No. 10,971,630, herein incorporated by reference in its entirety.

BACKGROUND

Vertically stacked gate-all-around (GAA) horizontal nanowire (NW) and nanosheet (NS) devices are promising for the next generation integrated circuits (IC) because they have good gate controllability, low leakage, and good scalability. In their channel region, the GAA NW and the GAA NS devices have multiple vertically stacked wire channels and sheet channels, respectively, which are wrapped around by gate dielectric layer(s) and a gate electrode. The vertical space between adjacent wire channels or sheet channels limits the thickness of the gate dielectric layer(s). For this reason, the GAA NW and the GAA NS devices may not be suitable for certain applications where a thick gate dielectric layer is needed, such as for input/output (I/O) functions. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 16A, 16B, and 16C illustrate top and cross-sectional views of the semiconductor structure during some fabrication steps of the method of FIGS. 15A-15B.

DETAILED DESCRIPTION

Figure 1:
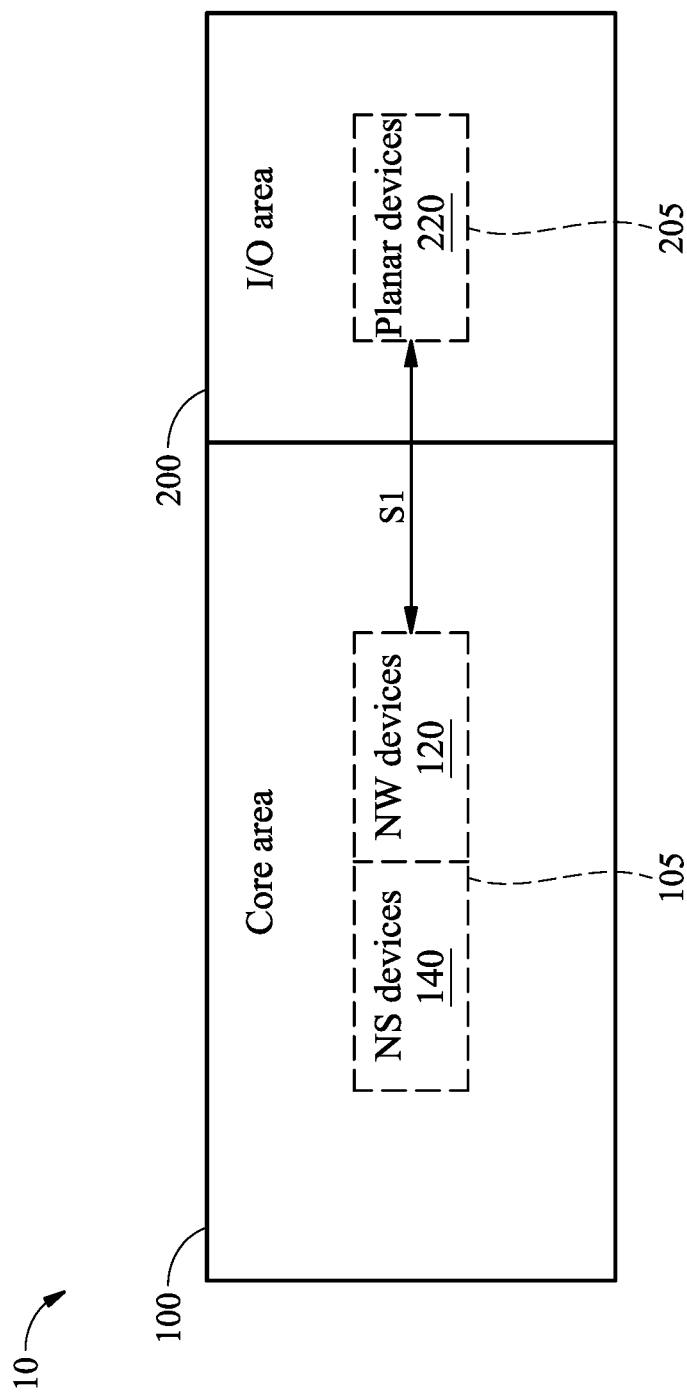
FIGS. 1 and 2 illustrate schematic block diagrams of a semiconductor structure (e.g., an IC) constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to an integrated circuit (IC) having vertically stacked gate-all-around (GAA) horizontal nanowire (NW) devices (or "GAA NW devices" for short) and vertically stacked GAA horizontal nanosheet (NS) devices (or "GAA NS devices" for short) integrated with planar devices on the same substrate. In an embodiment, the GAA NW devices and the GAA NS devices (collectively "the GAA devices") are placed in a core area of the IC, for example, for low-power circuits and high-speed circuits respectively, while the planar devices are placed in an I/O area of the IC for implementing I/O circuits, ESD (electrostatic discharge) circuits, BJT (bipolar junction transistors), resistors, capacitors, diodes, or other circuits. The planar devices have thicker gate dielectric than the GAA devices. In another embodiment, both the planar devices and the GAA devices are placed in the core area of the IC. The planar devices and the GAA devices have the same gate dielectric thickness, but the planar devices have a much longer gate length than the GAA devices. To further this embodiment, the planar devices may be used for implementing BJT, resistors, capacitors, diodes, or other circuits, while GAA devices may be used for implementing high-speed circuits and low-power circuits. Still further, the GAA NS devices are designed to have a channel width sufficiently larger than that of the GAA NW devices to provide performance differentiator between the two types of devices. For example, the ratio of the GAA NS devices' channel width to the GAA NW devices' channel width may be in a range of 1.3 to 10, such as from 1.5 to 4. With a wider channel, the GAA NS devices are more suitable for high-speed applications. With a narrower channel, the GAA NW devices are more suitable for low power and low leakage applications. Embodiments of the present disclosure provide flexible design integration schemes to accommodate different circuits in the same IC. Fabrication methods according to the present disclosure can be readily integrated into existing semiconductor manufacturing flows. Details of the various embodiments of the present disclosure are described by reference to the FIGS. 1-18D.

Referring to FIG. 1, shown therein is a schematic block diagram of a semiconductor structure 10 (e.g., an IC 10) constructed according to an embodiment of the present disclosure. The IC 10 includes a core area 100 and an I/O area 200. The core area 100 includes logic circuits, memory circuits, and other core circuits. The I/O area 200 includes I/O cells, ESD cells, and other circuits. The core area 100 includes a device region 105 where GAA NW devices 120 and GAA NS devices 140 are formed. In some embodiments, the GAA NW devices 120 and the GAA NS devices 140 are placed adjacent to each other (or abutted). The I/O area 200 includes a device region 205 where planar devices 220 are formed. The planar devices 220 are located away from the GAA devices 120 and 140 by spacing "S1."

Figure 2:
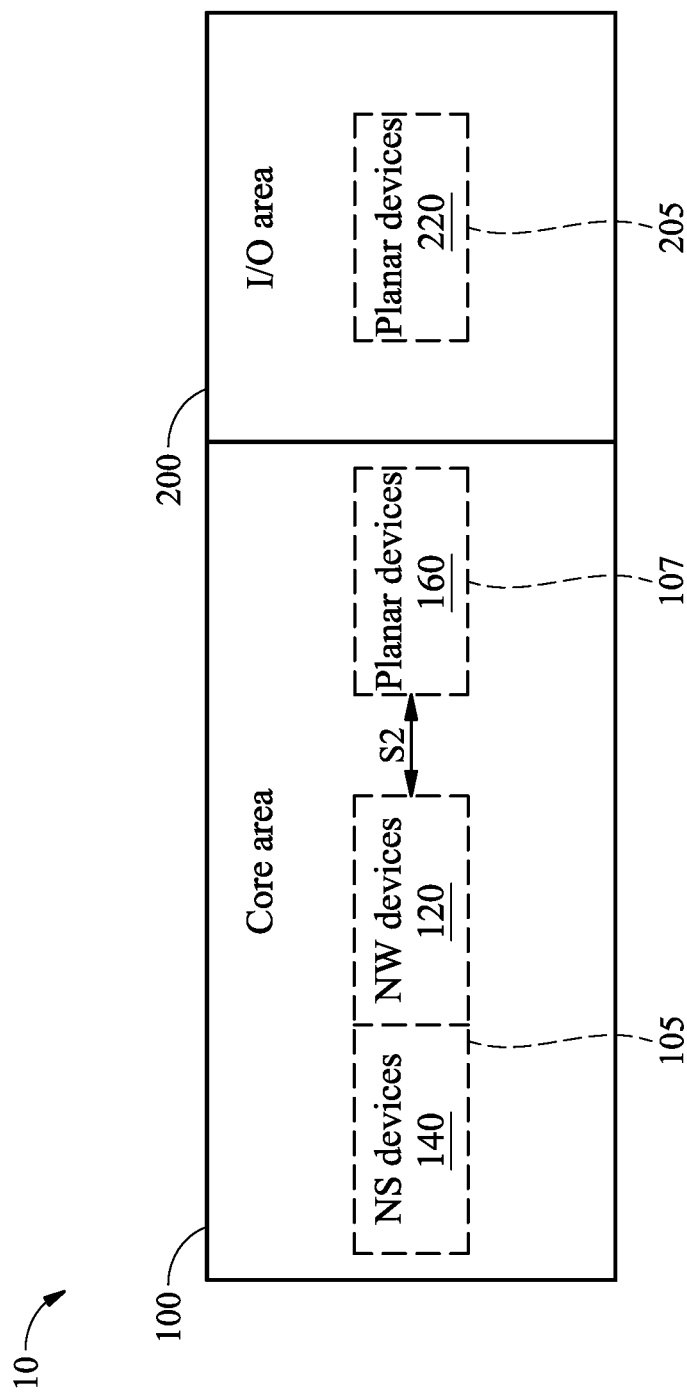

Referring to FIG. 2, shown therein is a schematic block diagram of the IC 10 constructed according to another embodiment of the present disclosure. In this embodiment, the IC 10 also includes the core area 100 and the I/O area 200 as discussed above. The core area 100 of the IC 10 further includes a device region 107 where planar devices 160 are formed. The planar devices 160 are located away from the GAA devices 120 and 140 by spacing "S2."

Figure 6:
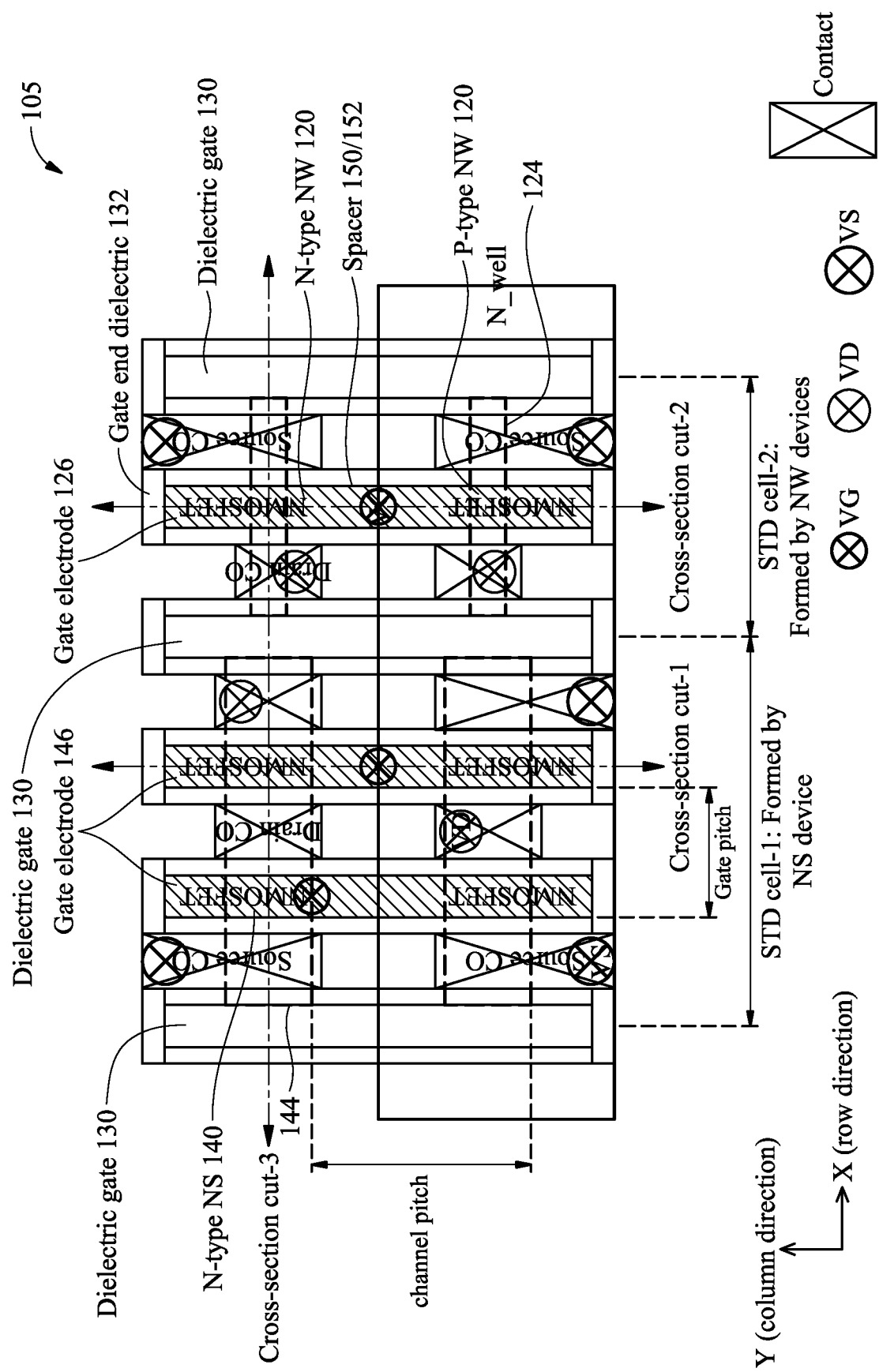
FIG. 6 illustrates a top view of a portion of the semiconductor structure of FIGS. 1-2, in accordance with some embodiments.

In the present embodiment, each of the spacing S1 and the spacing S2 is at least four (4) times of a gate pitch of the GAA devices 120 or 140 or at least four (4) times of a channel pitch of the GAA devices 120 or 140. An example gate pitch and an example channel pitch are illustrated in FIG. 6 as the edge-to-edge distance between two adjacent gates and the edge-to-edge distance between two adjacent channels, respectively. The gate pitch and the channel pitch can be defined using center-to-center distance instead of edge-to-edge distance in some embodiments. The spacing S2 is designed to ease manufacturing process by providing margins when patterning the device regions 105 and 107. The spacing S1 is designed to ease manufacturing process by providing margins when patterning the device regions 105 and 205. These will be further discussed later.

Figure 3:
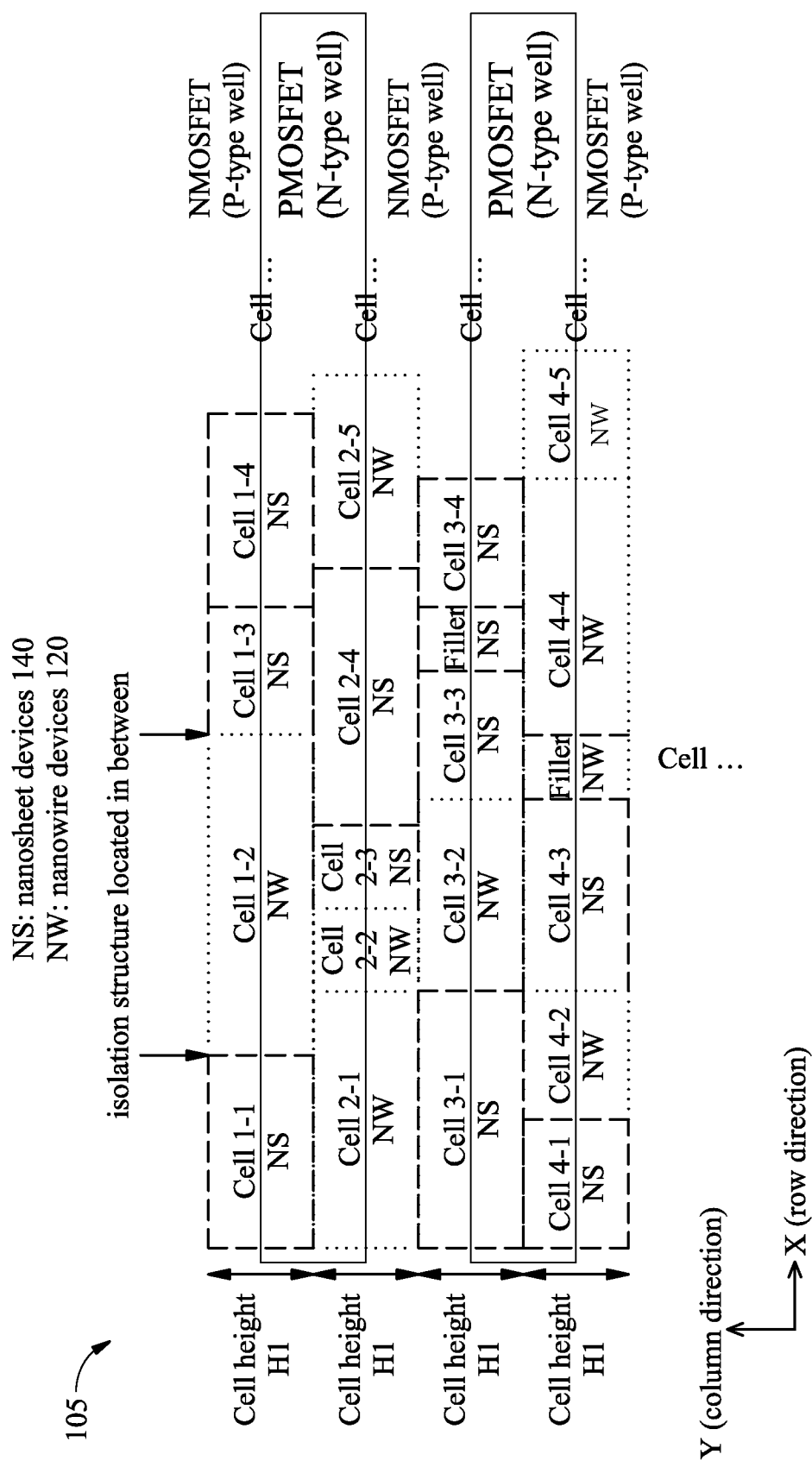
FIGS. 3, 4, and 5 show standard cell array layout diagrams of a portion of the semiconductor structure shown in FIGS. 1-2, according to aspects of the present disclosure.

Referring to FIG. 3, shown therein is a layout diagram of a portion of the device region 105, constructed according to an embodiment of the present disclosure. The device region 105 includes cells (or standard cells) arranged in columns and rows. FIG. 3 illustrates 4 rows of cells, where cells 1-n (n=1~4) are in a row; cells 2-m (m=1~5) are in a row; cells 3-k (k=1~4) are in a row; and cells 4-p (p=1~5) are in a row. In various embodiments, the rows in the device region 105 may include more cells or less cells than the layout shown in FIG. 3. In various embodiments, the device region 105 may include more rows or less rows and more columns or less columns than the layout shown in FIG. 3. Still referring to FIG. 3, each cell is implemented with one or more GAA NW devices or one or more GAA NS devices. Specifically, a cell may include a pair of an NMOSFET (or n-type) GAA NS device and a PMOSFET (or p-type) GAA NS device to make a CMOSFET GAA NS cell (or "NS cell" for short); and a cell may include a pair of an NMOSFET GAA NW device and a PMOSFET GAA NW device to make a CMOSFET GAA NW cell (or "NW cell" for short). The n-type GAA NS devices and the n-type GAA NW devices are built on P-type wells. The p-type GAA NS devices and the p-type GAA NW devices are built on N-type wells. In the present embodiment, each row includes both the NS cells and the NW cells (referred to as a "mixed row"). The height of a mixed row (a dimension along the column direction Y) is dominated by the height of the NS cells in the row which have a wider channel than the NW cells in the same row. Thus, all mixed rows in this layout have the same height H1, which makes the layout design easier. Some of the mixed rows may further include an isolation structure between an NS cell and an adjacent NW cell. Some of the mixed rows may further include "filler" cells which do not provide circuit functions other than separating two adjacent cells. The filler cells can be either a non-functional NS cell or a non-functional NW cell.

Figure 4:
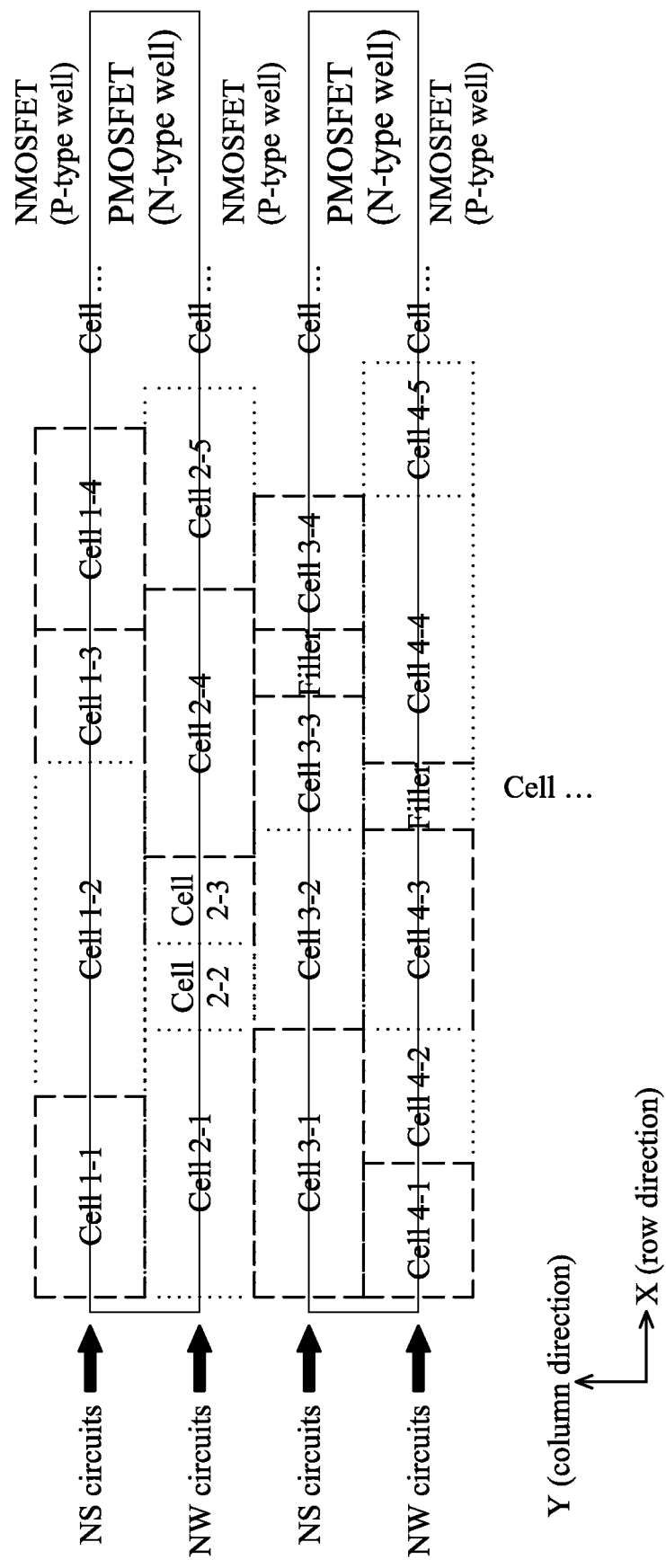

Referring to FIG. 4, shown therein is a layout diagram of a portion of the device region 105, constructed according to another embodiment of the present disclosure. The device region 105 in this embodiment also includes NS cells and NW cells arranged in columns and rows. However, in this embodiment, each row includes only one type of cells, either all NS cells or all NW cells. Further, the rows having all NS cells (referred to as "NS rows") and the rows having all NW cells (referred to as "NW rows") are alternately arranged. Each NS row is wider along the column direction Y than each NW row because the GAA NS device (in the NS row) has a wider channel than the GAA NW device (in the NW row). Further, some of the rows in this layout may further include "filler" cells as discussed above.

Figure 5:
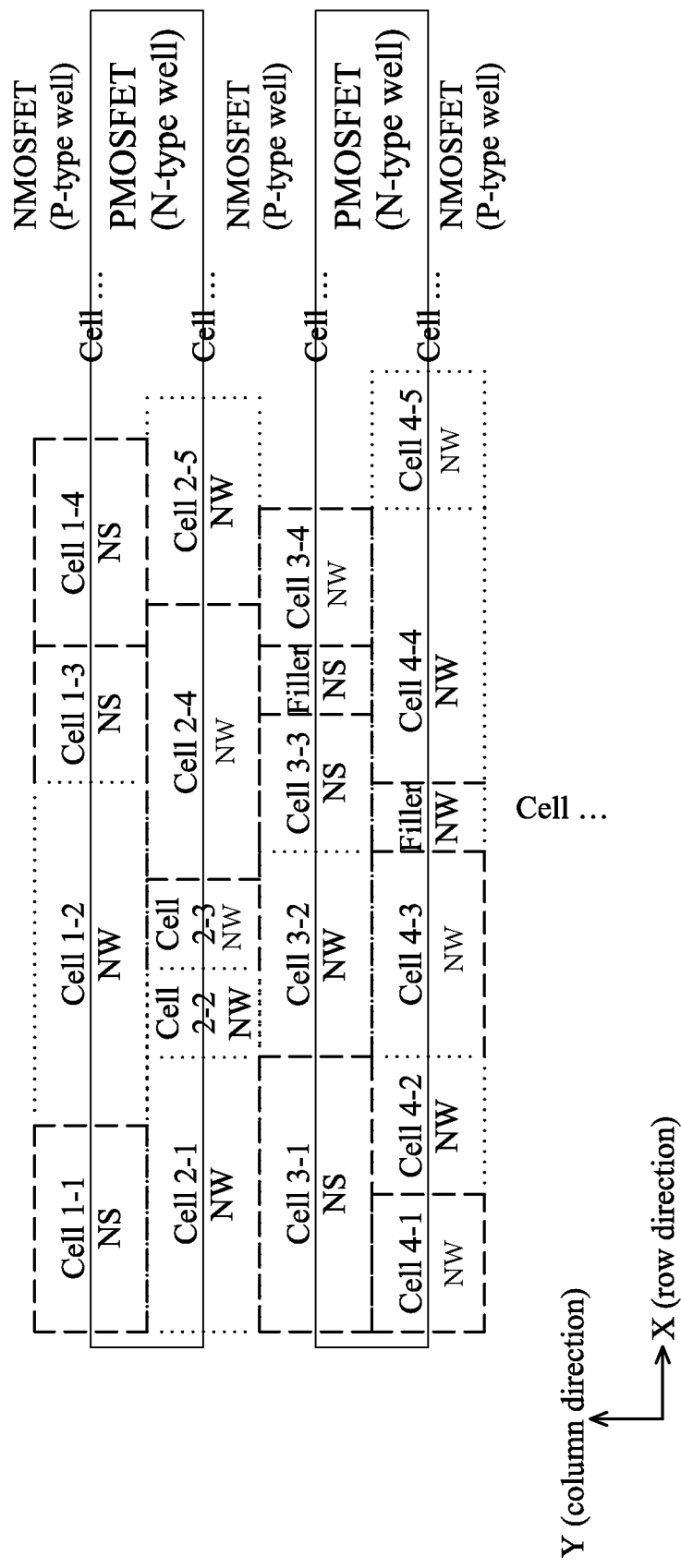

Referring to FIG. 5, shown therein is a layout diagram of a portion of the device region 105, constructed according to yet another embodiment of the present disclosure. The device region 105 in this embodiment also includes NS cells and NW cells arranged in columns and rows. However, in this embodiment, some rows are mixed rows, and other rows are NW rows, where the mixed rows and the NW rows are alternately arranged. Some of the mixed rows may include filler cell(s) which may be either an NS filler cell or an NW filler cell. Some of the NW rows may also include filler cell(s) which are NW filler cell(s).

Referring to FIG. 6, shown therein is a top view of a portion of the device region 105 that includes two standard cells: a "STD cell-1" formed by GAA NS devices (i.e., it is an NS cell), and a "STD cell-2" formed by GAA NW devices (i.e., it is an NW cell). FIG. 6 illustrates various components of the two cells. The "STD cell-1" is a NAND gate in this embodiment. It includes two p-type GAA NS devices 140 formed in a N-type well ("N well") and two n-type GAA NS devices 140. The "STD cell-2" is an inverter in this embodiment. It includes one p-type GAA NW device 120 formed in the N well and one n-type GAA NW device 120. FIG. 6 also shows dielectric gates 130 and gate end dielectric layer 132 at the boundaries of the cells for isolation purposes. FIG. 6 further shows various source and drain contacts and via plugs including gate via plugs ("VG"), drain via plugs ("VD"), and source via plugs ("VS"). The two cells "STD cell-1" and "STD cell-2" have the same height H1 (see FIG. 7) along the column direction Y.

Figure 7:
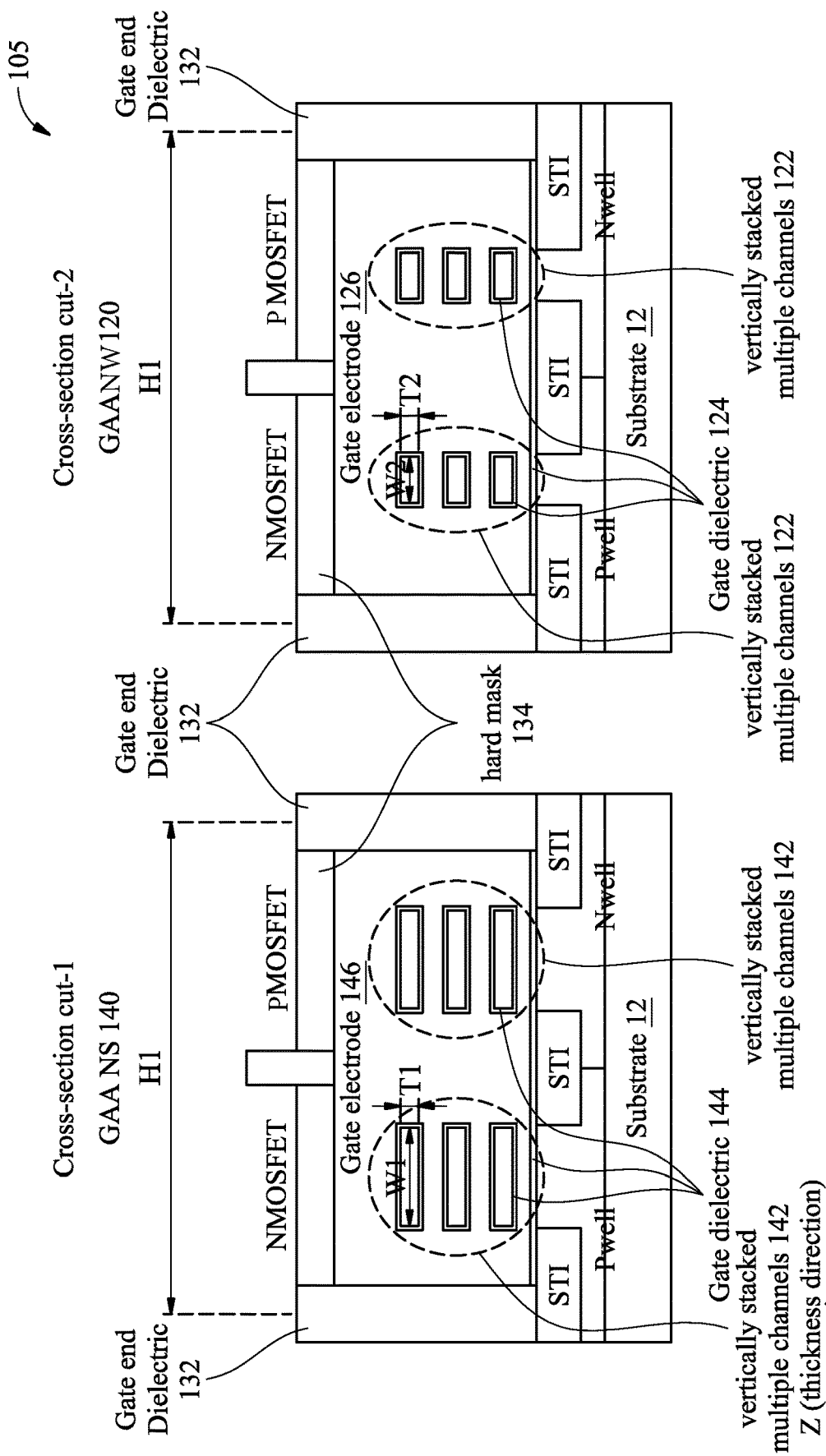
FIGS. 7 and 8 illustrate cross-sectional views of the portion in FIG. 6, in accordance with some embodiments.
Figure 8:
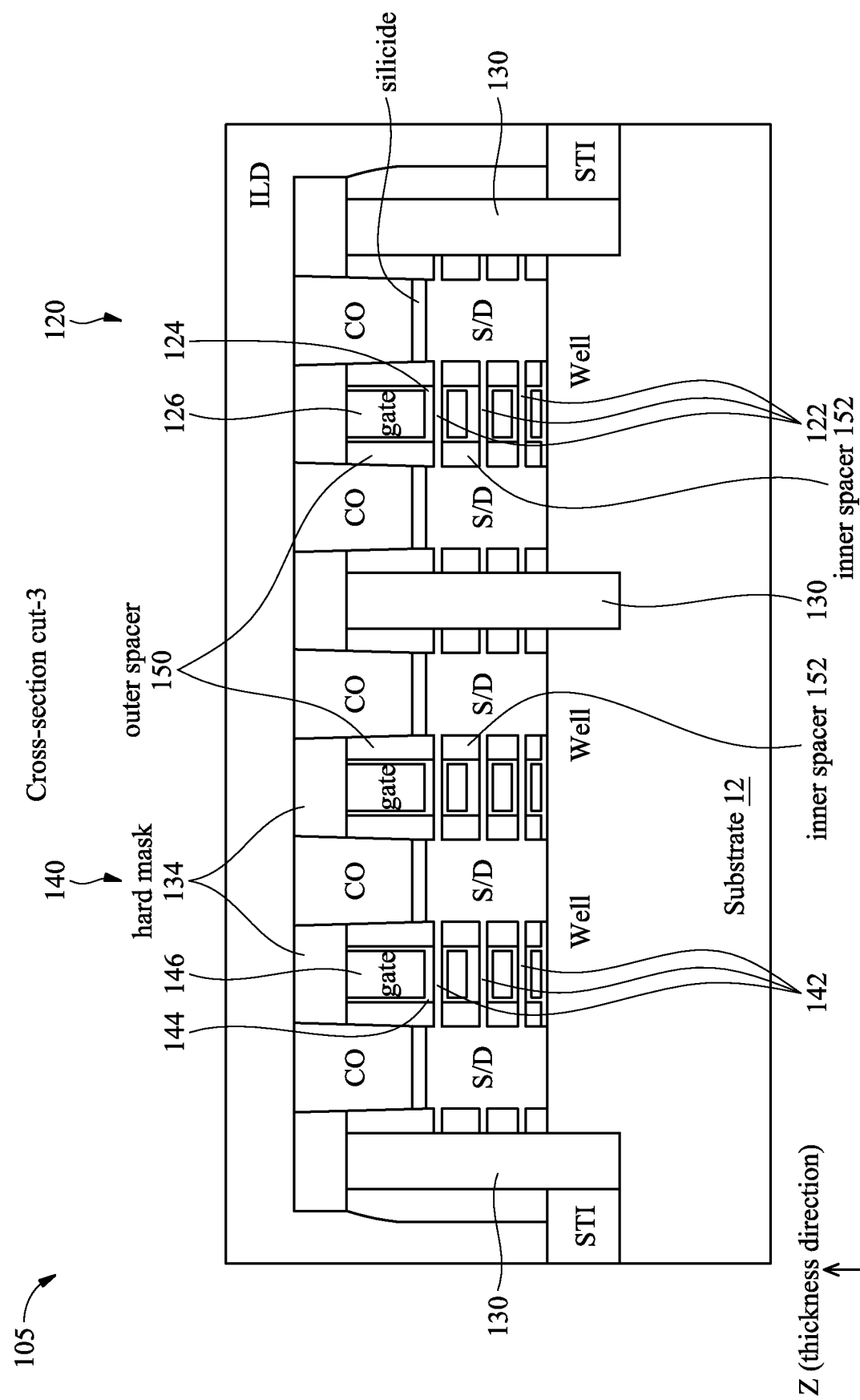

FIG. 7 shows two cross-sectional views of the device region 105 along the "cross-section cut-1" and the "cross-section cut-2" of FIG. 6 which cut along a gate electrode 146 of "STD cell-1" and a gate electrode 126 of "STD cell-2" lengthwise, respectively. FIG. 8 shows a cross-sectional view of the device region 105 along the "cross-section cut-3" of FIG. 6 which cuts along the channel 144 of the "STD cell-1" and the channel 124 of the "STD cell-2" lengthwise.

Referring to FIG. 7, the device region 105 includes an NMOSFET GAA NW device 120 and a PMOSFET GAA NW device 120. The NMOSFET GAA NW device 120 is formed over a p-type well "Pwell" and the PMOSFET GAA NW device 120 is formed over an n-type well "Nwell." The Pwell and the Nwell are provided in or on a substrate 12. The substrate 12 may include a silicon substrate (e.g., a silicon wafer) or another semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The active regions of the two GAA NW devices 120 are separated by an isolation structure, such as shallow trench isolation (STI). Each of the two GAA NW devices 120 includes vertically stacked multiple channels 122. Although FIG. 7 illustrates three channels 122, the GAA NW device 120 may include two or more vertically stacked channels 122 in various embodiments. For example, the number of channels 122 in each GAA NW device 120 may be in a range of 2 to 10. Each of the channels 122 includes silicon or another suitable semiconductor material. Each of the channels 122 has a width (or channel width) W2 and a thickness (or channel thickness) T2. Each of the channels 122 is wrapped around by a gate dielectric layer 124, which may include a high-k dielectric material. A gate electrode 126 wraps around the gate dielectric layer 124. The gate electrode 126 may include one or more work function metal layers and a bulk metal layer. In this embodiment, the PMOSFET and the NMOSFET GAA NW devices 120 share the same gate electrode 126. The gate end dielectric 132 is disposed over the STI and at the end of the gate electrode 126. A hard mask 134 is disposed over the gate electrode 126.

Still referring to FIG. 7, the device region 105 includes an NMOSFET GAA NS device 140 and a PMOSFET GAA NS device 140. The NMOSFET GAA NS device 140 is formed over a p-type well "Pwell" and the PMOSFET GAA NS device 140 is formed over an n-type well "Nwell." The Pwell and the Nwell are provided in or on the substrate 12. The active regions of the two GAA NS devices 140 are separated by an isolation structure, such as shallow trench isolation (STI). Each of the two GAA NS devices 140 includes vertically stacked multiple channels 142. Although FIG. 7 illustrates three channels 142, the GAA NS device 140 may include two or more vertically stacked channels 142 in various embodiments. For example, the number of channels 142 in each GAA NS device 140 may be in a range of 2 to 10. Each of the channels 142 includes silicon or another suitable semiconductor material. Each of the channels 142 has a width (or channel width) W1 and a thickness (or channel thickness) T1. Each of the channels 142 is wrapped around by a gate dielectric layer 144, which may include a high-k dielectric material. A gate electrode 146 wraps around the gate dielectric layer 144. The gate electrode 146 may include one or more work function metal layers and a bulk metal layer. In this embodiment, the PMOSFET and the NMOSFET GAA NS devices 140 share the same gate electrode 146. The gate end dielectric 132 is disposed over the STI and at the end of the gate electrode 146. A hard mask 134 is disposed over the gate electrode 146.

In the present embodiment, the number of channels 122 in each GAA NW device 120 is the same as the number of channels 142 in each GAA NS device 140; the materials in the channels 122 are the same or substantially the same as the materials in the channels 142; and the thickness T1 and the thickness T2 are the same or substantially the same. The thicknesses T1 and T2 may be in a range of 3 nm to 8 nm in various embodiments. The gate dielectric layer 124 and the gate dielectric layer 144 have the same or substantially the same thickness, which is 2.5 nm or less in the present embodiment. The width W1 is greater than the width W2. The width W1 is equal to or less than 60 nm and the width W2 is equal to or less than 20 nm. For example, the width W1 is in a range of 12 nm to 40 nm, and the width W2 is in a range of 4 nm to 11 nm in various embodiments. A ratio of W1 to W2 may be in a range of 1.3 to 10, such as from 1.5 to 4. The widths W1 and W2 and the ratio of W1 to W2 are designed to provide sufficient differentiation between the performance of the GAA NS device 140 and the GAA NW device 120. A wider channel in the GAA NS device 140 provides higher drive current $I_{on}$, and a narrower channel in the GAA NW device 120 provides lower leakage and lower power consumption. Thus, the GAA NS device 140 is more suitable for high-speed applications, while the GAA NW device 120 is more suitable for low power and non-speed-critical applications. If the ratio of W1 to W2 is too small (less than 1.3 or near 1.0), then the GAA NS device 140 and the GAA NW device 120 would perform about the same, thus not providing sufficient design flexibility for circuit designers. If the ratio of W1 to W2 is too big (e.g., more than 10), fabrication of both devices on the same IC would be challenging for at least two reasons. One reason is that the channels 142 are formed by etching and removing semiconductor material(s) that is originally disposed between two vertically adjacent channels 142 (such as the silicon germanium layer 111 between adjacent silicon layers 113 in FIG. 16C). Having a wider channel 142 makes it more difficult to etch and remove those semiconductor material(s). Another reason is that having a wider channel 142 makes it more difficult to deposit the gate dielectric layer 144 to wrap around the channel 142. For example, it would be more difficult for the deposited materials to reach the surfaces of the channels 142 if the channels are very wide and the vertical space between the channels is small. Thus, the ratio of W1 to W2 in the present disclosure is limited to about 1.3 to 10, and the values of the W1 and W2 are limited as discussed above.

Referring to FIG. 8, the GAA NW device 120 further includes spacers 150 and 152 disposed on the sidewalls of the gate dielectric layer 124 and the gate electrode 126. The spacer 150 is disposed above the topmost channel in the vertically stacked channels 122 and is also referred to as the outer spacer 150. The spacer 152 is disposed between adjacent two channels 122 and between the bottommost channel 122 and the substrate 12. It is also referred to as the inner spacer 152. The outer spacer 150 and the inner spacer 152 may have the same or different materials. In an embodiment, the outer spacer 150 is formed before the inner spacer 152 is formed. For example, the outer spacer 150 and a dummy gate (not shown) may be disposed over and engaging a fin which includes a stack of silicon layers and silicon germanium layers alternately arranged. Then, the fin outside of the outer spacer 150 and the dummy gate is etched to form S/D trenches, corresponding to the space where the source/ drain "S/D" and the source/drain contact "CO" are located. Then, the silicon germanium layers that are directly underneath the outer spacer 150 and exposed through the S/D trenches are etched to form cavities between adjacent silicon layers. Subsequently, one or more dielectric materials are filled into the cavities to form the inner spacer 152. This is followed by the formation of the S/D in the S/D trenches (e.g., by epitaxially growing a silicon layer and doping the silicon layer with an appropriate p-type or n-type dopant) and replacement of the dummy gate with the gate dielectric 124 and the gate electrode 126. The GAA NS device 140 similarly includes the outer spacer 150 and the inner spacer 152 disposed on the sidewalls of the gate dielectric layer 144 and the gate electrode 146. Also shown in FIG. 8, there may be a silicide layer between the S/D and the source/drain contact.

Figure 9:
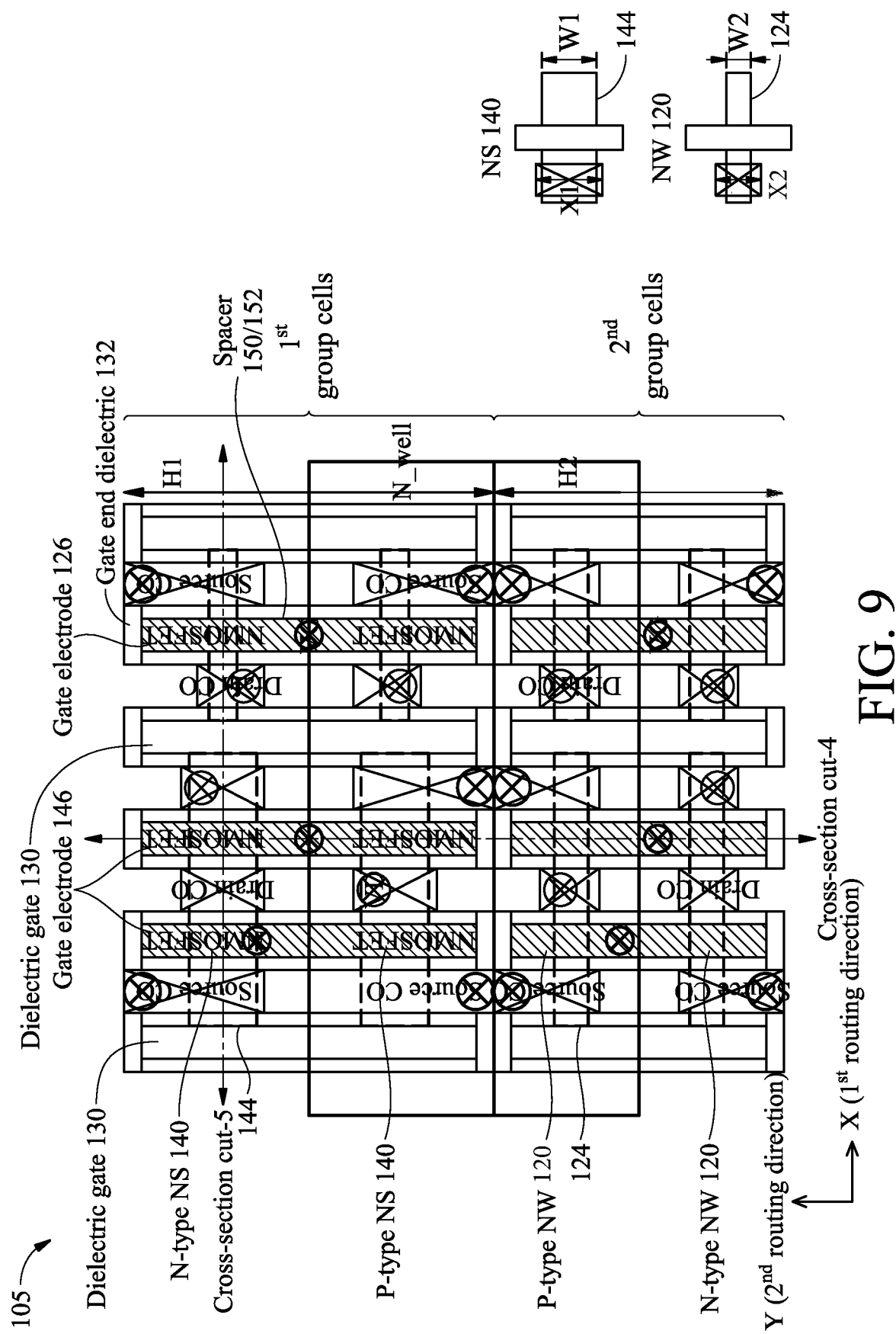
FIG. 9 illustrates a top view of a portion of the semiconductor structure of FIGS. 1-2, in accordance with some embodiments.

FIG. 9 illustrates a top view of a portion of the device region 105 that includes multiple standard cells placed according to the layout diagram shown in FIG. 4. Referring to FIG. 9, the device region 105 includes a first group of NS cells arranged in a row and a second group of NW cells arranged in another row. Each NS cell includes a pair of an NMOSFET (or n-type) GAA NS device 140 and a PMOSFET (or p-type) GAA NS device 140. Each NW cell includes a pair of an NMOSFET (or n-type) GAA NW device 120 and a PMOSFET (or p-type) GAA NW device 120. The NS cells have a cell height H1, and the NW cells have a cell height H2, where H1 is greater than H2. The device region 105 includes dielectric gates 130 at the boundaries of the cells and being parallel to the gate electrodes 126 and 146 lengthwise (along the "Y" direction). The device region 105 further includes gate end dielectric 132 at both ends of each of the gate electrodes 126 and 146 and the dielectric gates 130. The channels 124 and 144 are oriented lengthwise along the row direction (the "X" direction), perpendicular to the gate electrodes 126 and 146. The widths of the channels 124 and 144 are W2 and W1 respectively, as discussed above. The device region 105 further includes source contacts "Source CO" and drain contacts "Drain CO" (collectively "S/D contacts"). The S/D contacts of the NS cells has a width X1 along the "Y" direction, the S/D contacts of the NW cells has a width X2 along the "Y" direction, where X1 is greater than X2. For example, a ratio of X1 to X2 may be in a range of 1.1 to 5. This is to accommodate the fact that W1 is greater than W2 and a ratio of W1 to W2 is in a range of 1.3 to 10 as discussed above.

Figure 10:
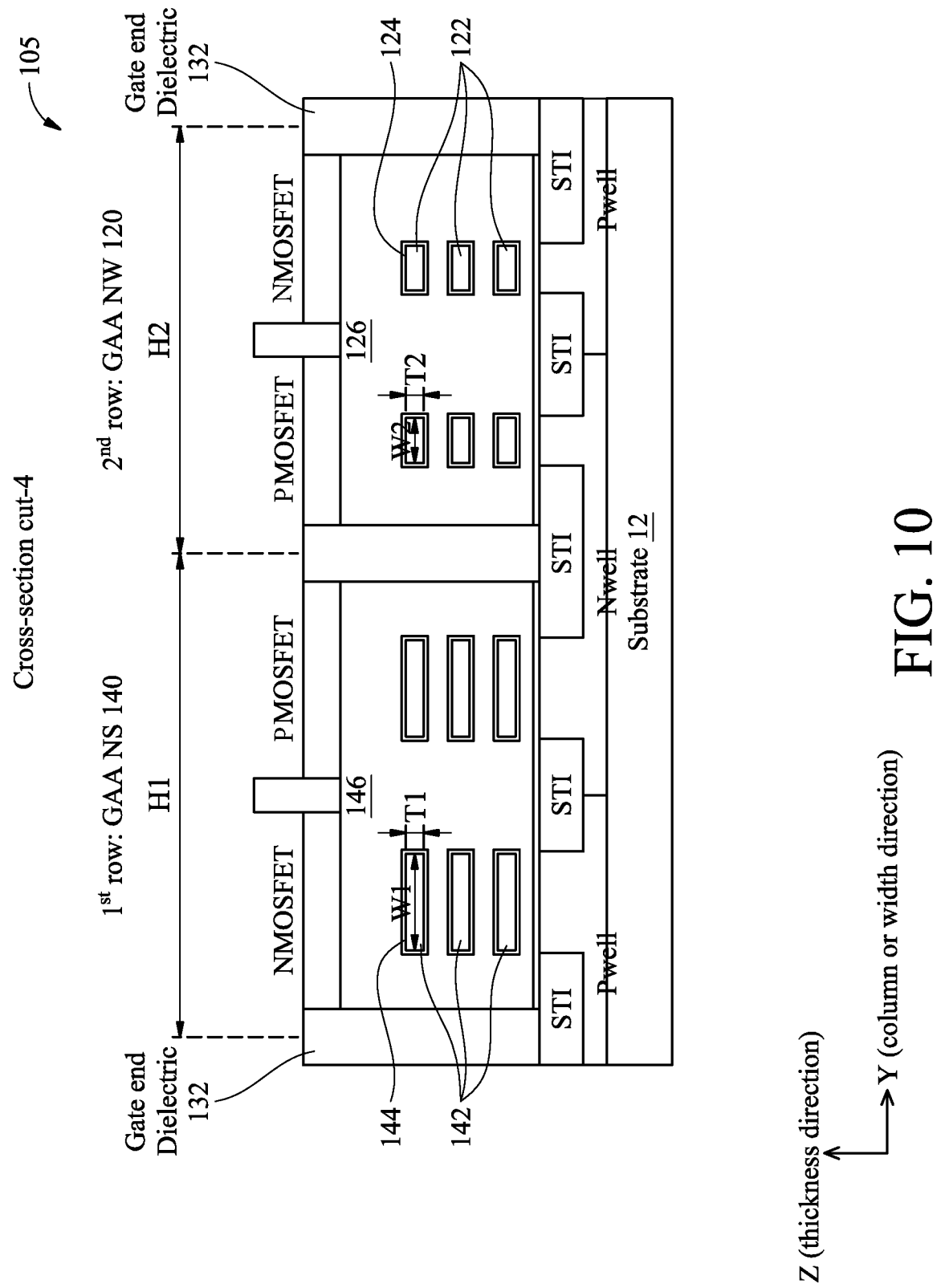
FIGS. 10 and 11 illustrate cross-sectional views of the portion in FIG. 9, in accordance with some embodiments.

FIG. 10 shows a cross-sectional view of the device region 105 along the "cross-section cut-4" of FIG. 9 which cut along the gate electrodes 126 and 146 lengthwise. Referring to FIG. 10, the device region 105 includes an NS cell abutting an NW cell. The NS cell includes a PMOSFET GAA NS device 140 and an NMOSFET GAA NS device 140. The NW cell includes a PMOSFET GAA NW device 120 and an NMOSFET GAA NW device 120. The gate electrode 146 of the NS cell and the gate electrode 126 of the NW cell are separated by the gate end dielectric 132. The NS cell has a height H1 and the NW cell has a height H2, where H1 is greater than H2. Other aspects of the device region 105 in FIG. 10 are the same as those in FIG. 7, with like reference numerals representing like features. The details of FIG. 10 are omitted here for simplicity.

Figure 11:
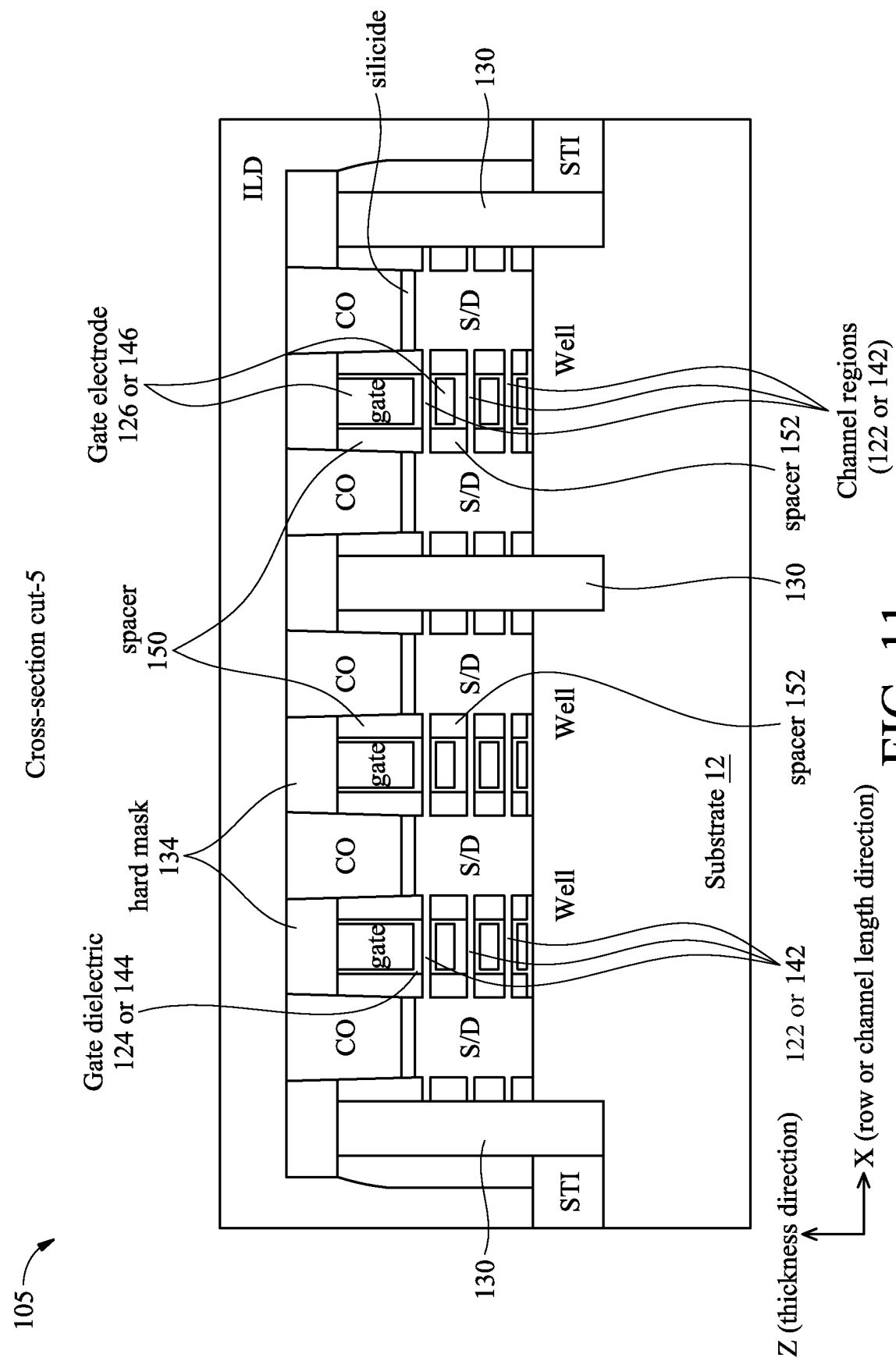

FIG. 11 shows a cross-sectional view of the device region 105 along the "cross-section cut-5" of FIG. 9 which cuts along the channel 142 of the GAA NS devices. Notably, the device region 105 has a similar cross-sectional view when cut along the channel 122 of the GAA NW devices. Therefore, FIG. 11 is labeled with features of both GAA NW devices and GAA NS devices. Referring to FIG. 11, the device region 105 includes the substrate 12 and wells formed over the substrate 12. The wells can be either n-type doped (for PMOSFET GAA NS or NW devices) or p-type doped (for NMOSFET GAA NS or NW devices) depending on where the cross-section is taken in FIG. 9. The GAA NS or NW devices are over the wells and have channels 142 or 122, gate dielectric layers 144 or 124, gate electrodes 146 or 126, outer spacers 150, inner spacers 152, source/drain features, source/drain contacts, and silicide features, as discussed with reference to FIG. 8. Also, adjacent cells are isolated by dielectric gates 130. The device region 105 further includes STI features, hard mask 134 over the gate electrodes 126/146 and the outer spacer 150, and an interlayer dielectric (ILD) layer over the cells. Many aspects of the device region 105 in FIG. 11 are the same as those in FIG. 8, with like reference numerals representing like features. The details of FIG. 11 are omitted here for simplicity.

Figure 12:
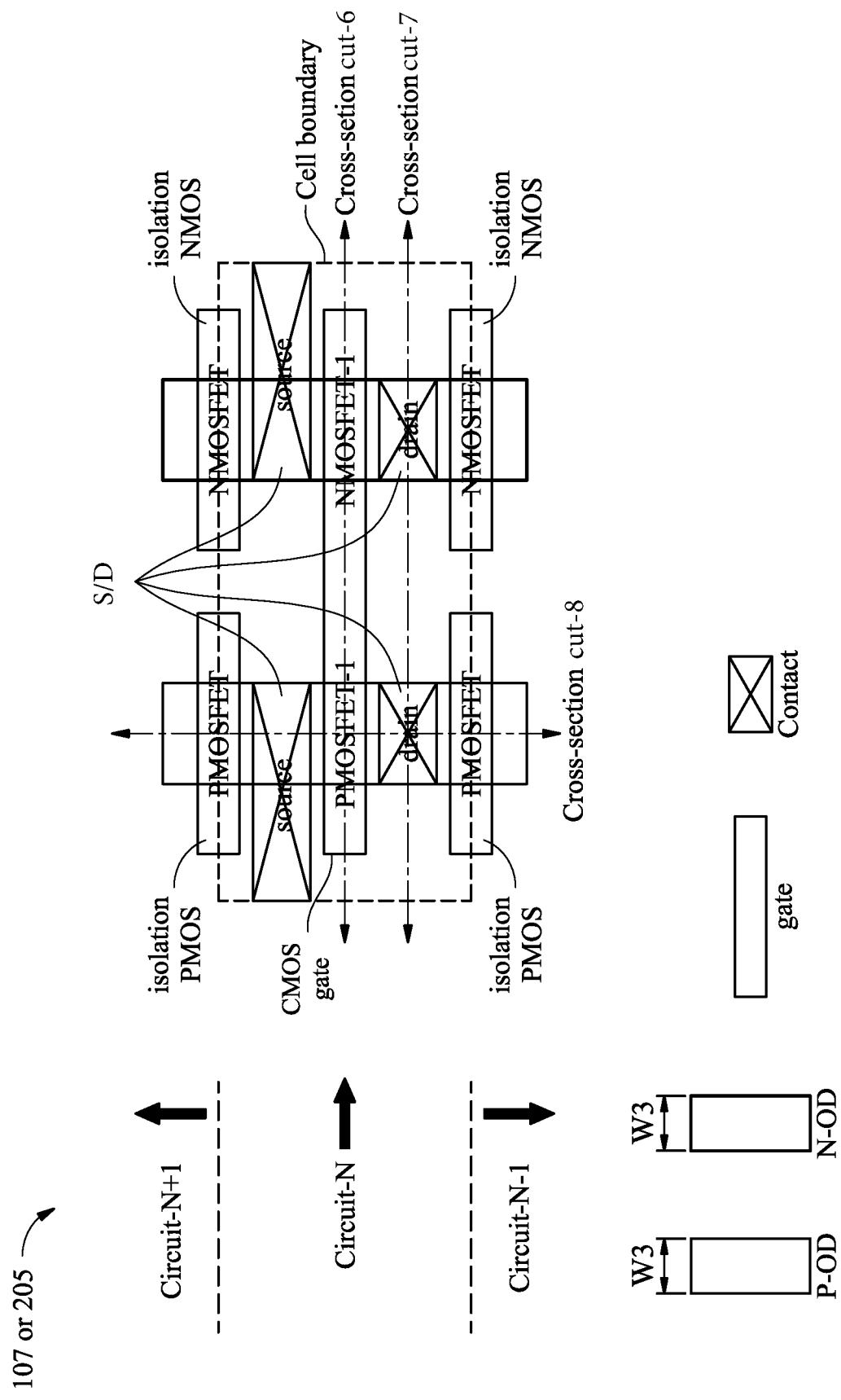
FIG. 12 illustrates a top view of a portion of the semiconductor structure of FIGS. 1-2, in accordance with some embodiments.
Figure 13:
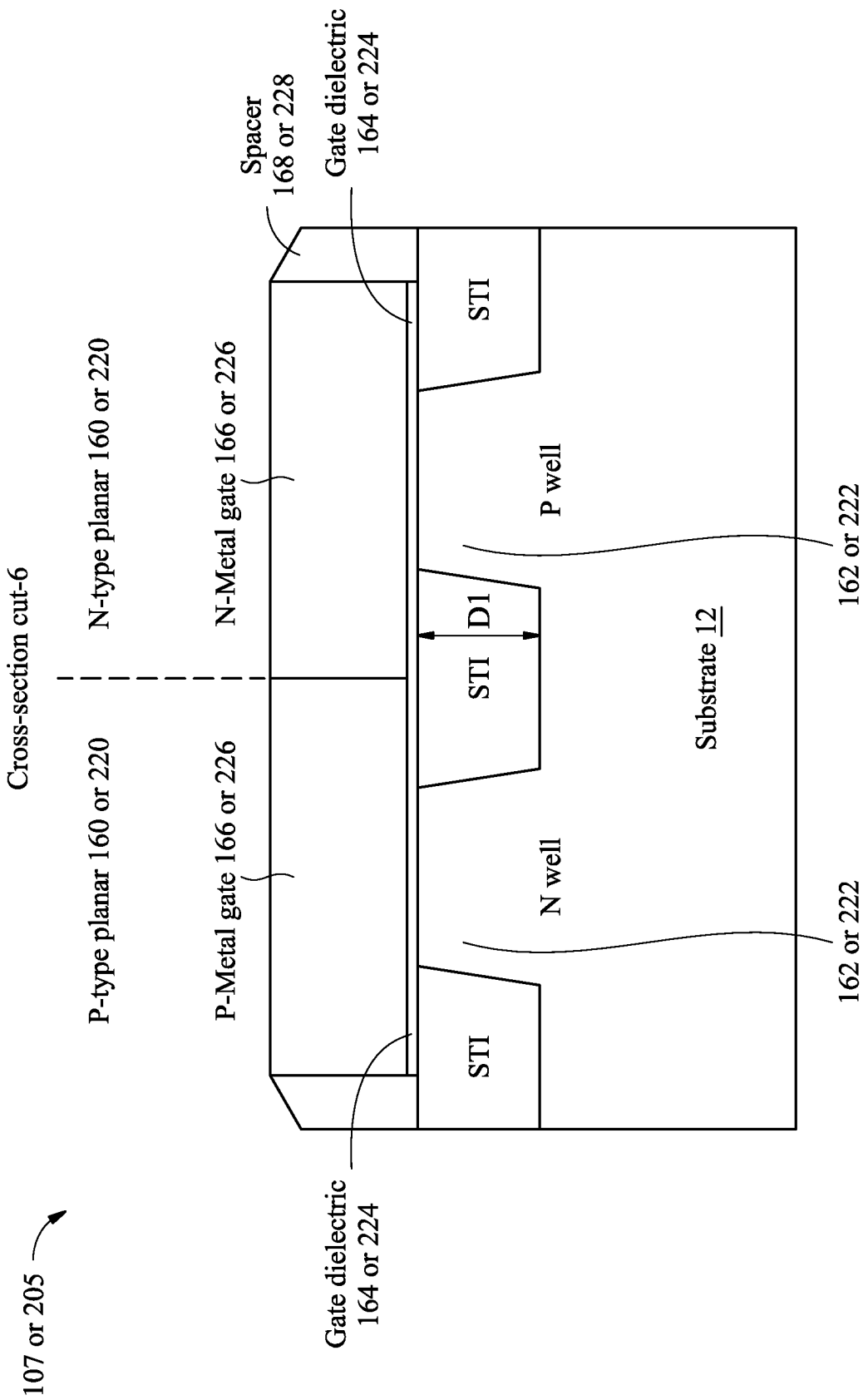
FIGS. 13 and 14 illustrate cross-sectional views of the portion in FIG. 12, in accordance with some embodiments.
Figure 14:
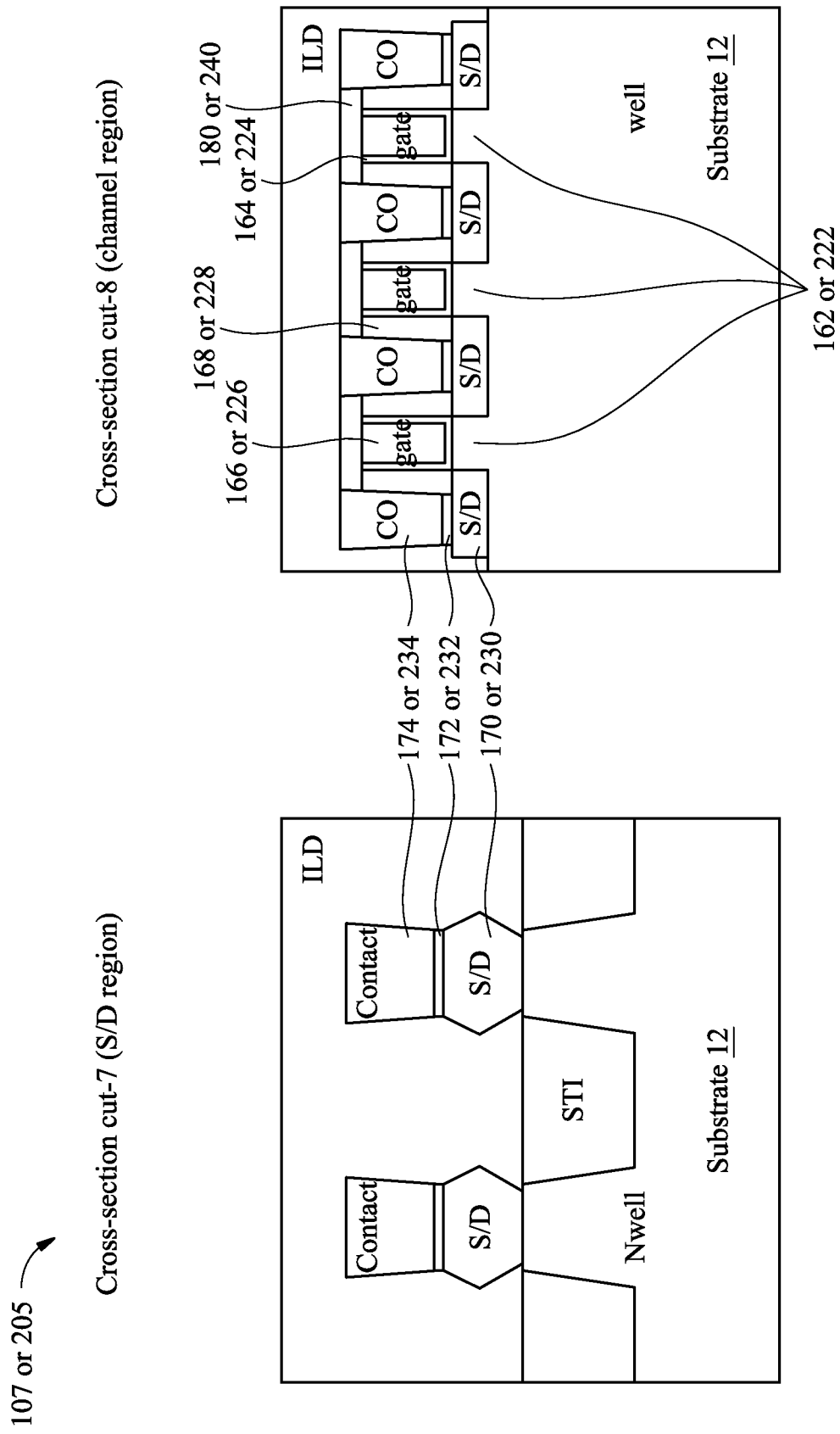

FIG. 12 illustrates an example layout diagram in the device region 107 or 205 for planar devices. FIG. 12 shows one standard cell ("Circuit-N"), although the device region 107 or 205 may include any number of cells. The Circuit-N includes a PMOSFET planar device 160 or 220 and an NMOSFET planar device 160 or 220 to form a CMOSFET planar circuit. The PMOSFET planar device 160 or 220 includes a gate electrode over a p-type planar active region (P-OD). The NMOSFET planar device 160 or 220 includes the gate electrode over an n-type planar active region (N-OD). The channel width W3 of the planar active regions P-OD and N-OD is greater than the channel widths W1 and W2 of the GAA NS and NW devices. For example, the width W3 is more than 60 nm, such as in a range of 60 nm to 3,000 nm. In an embodiment, the width W3 is more than 120 nm. Such wider channel is suitable for I/O cells, ESD cells, capacitors, and other types of circuits implemented in the device regions 107 and/or 205. Further, the gate length Lg of the planar devices is at least twice of that of the GAA NS and NW devices. For example, Lg is at least 50 nm for the planar devices 160 and 220 and is at most 20 nm for the GAA NS and NW devices 120 and 140. Because of such long gate length, the planar devices 160 and 220 do not suffer from short channel effects (such as drain-induced barrier lowering, impact ionization, hot carrier injection) that the GAA NS and NW devices 140 and 120 are designed to overcome. Rather, these planar devices 160 and 220 are designed for handling higher load, higher drive, ESD protection, analog functions, and/or passive devices. Contact features are disposed in the source and drain regions of the planar devices. Some isolation (non-functional) PMOSFET and NMOSFET are disposed at the boundary of the planar cell for isolating adjacent cells. FIG. 13 shows the device region 107 or 205 along the cross-section cut-6 which cuts along the gate electrode lengthwise. FIG. 14 shows the device region 107 or 205 along the cross-section cut-7 which cuts along the source/drain regions in a direction parallel to the gate electrode. FIG. 14 also shows the device region 107 or 205 along the cross-section cut-8 which cuts along the device in a direction perpendicular to the gate electrode.

Referring to FIG. 13, the device region 107 (205) includes a p-type planar device 160 (220) formed over an n-type well, and an n-type planar device 160 (220) formed over a p-type well. Each of the planar device 160 (220) includes an active region 162 (222), a gate dielectric layer 164 (224) over the active region, and a metal gate 166 (226) over the gate dielectric layer 164 (224). The active regions are isolated by STI, which may have a depth D1 of 60 nm to 300 nm. Spacers 168 (228) are disposed on sidewalls of the gate electrodes 166 (226). In the device region 107, the gate dielectric layer 164 has the same or substantially same thickness as the gate dielectric layers 124 and 144 for the GAA NW and NS devices. In an embodiment, the gate dielectric layer 164 is equal to or less than 2.5 nm. In the device region 205, the gate dielectric layer 224 is thicker than the gate dielectric layers 124, 144, and 164. In an embodiment, the gate dielectric layer 224 is equal to or greater than 3 nm. The thicker gate dielectric reduces leakage in the planar devices 220.

Referring to FIG. 14, in the device region 107 (205), the planar devices may include epitaxially grown S/D features 170 (230), silicide features 172 (232) over the S/D features, contacts 174 (234) over the silicide features. The device region 107 (205) further includes a dielectric layer 180 (240) over the gate electrodes 166 (226) and the spacers 168 (228), and an ILD layer covering the planar devices.

Figure 15A:
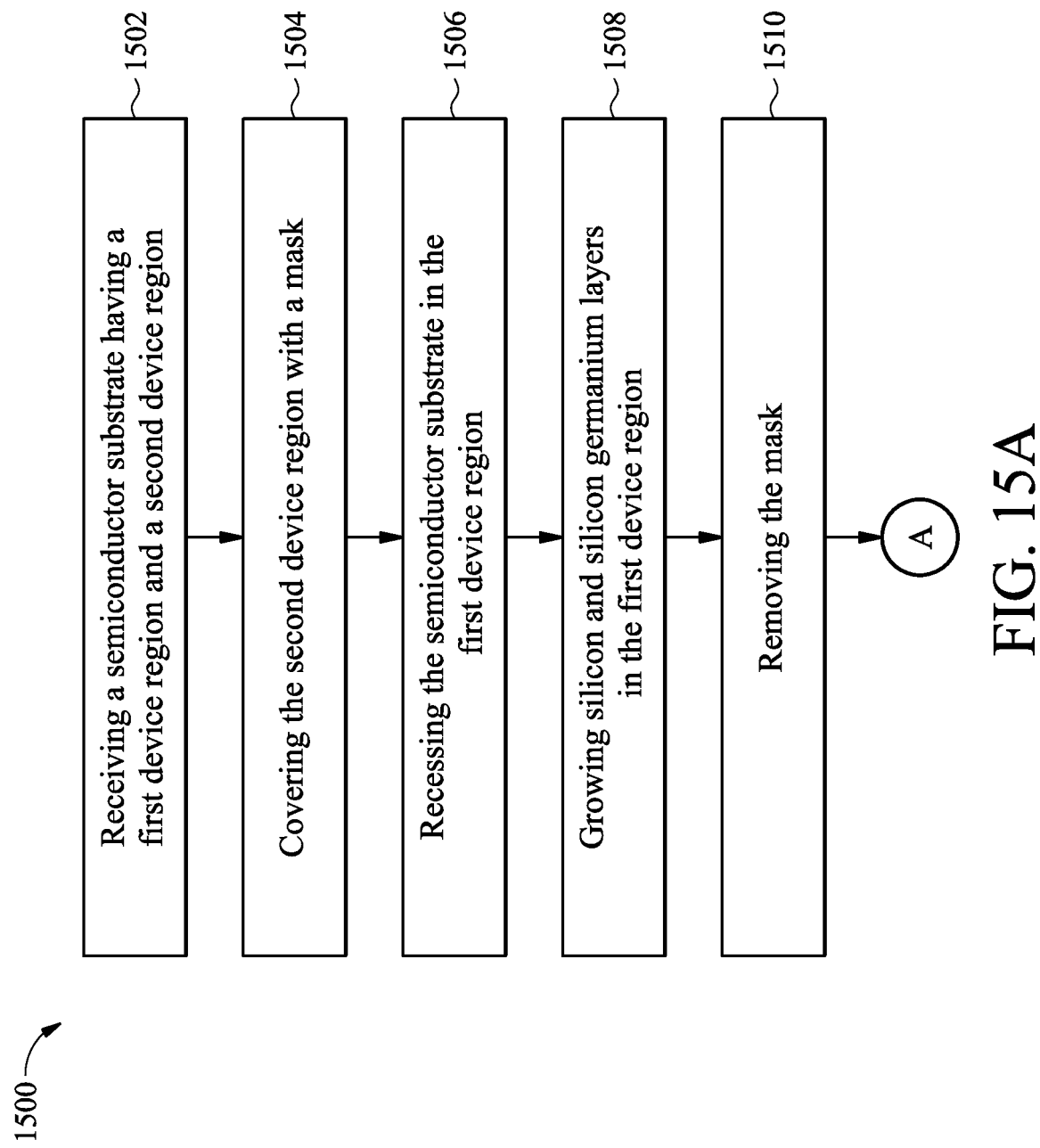
FIGS. 15A and 15B show a flow chart of a method for forming the semiconductor structure shown in FIGS. 1-2, according to aspects of the present disclosure.
Figure 15B:
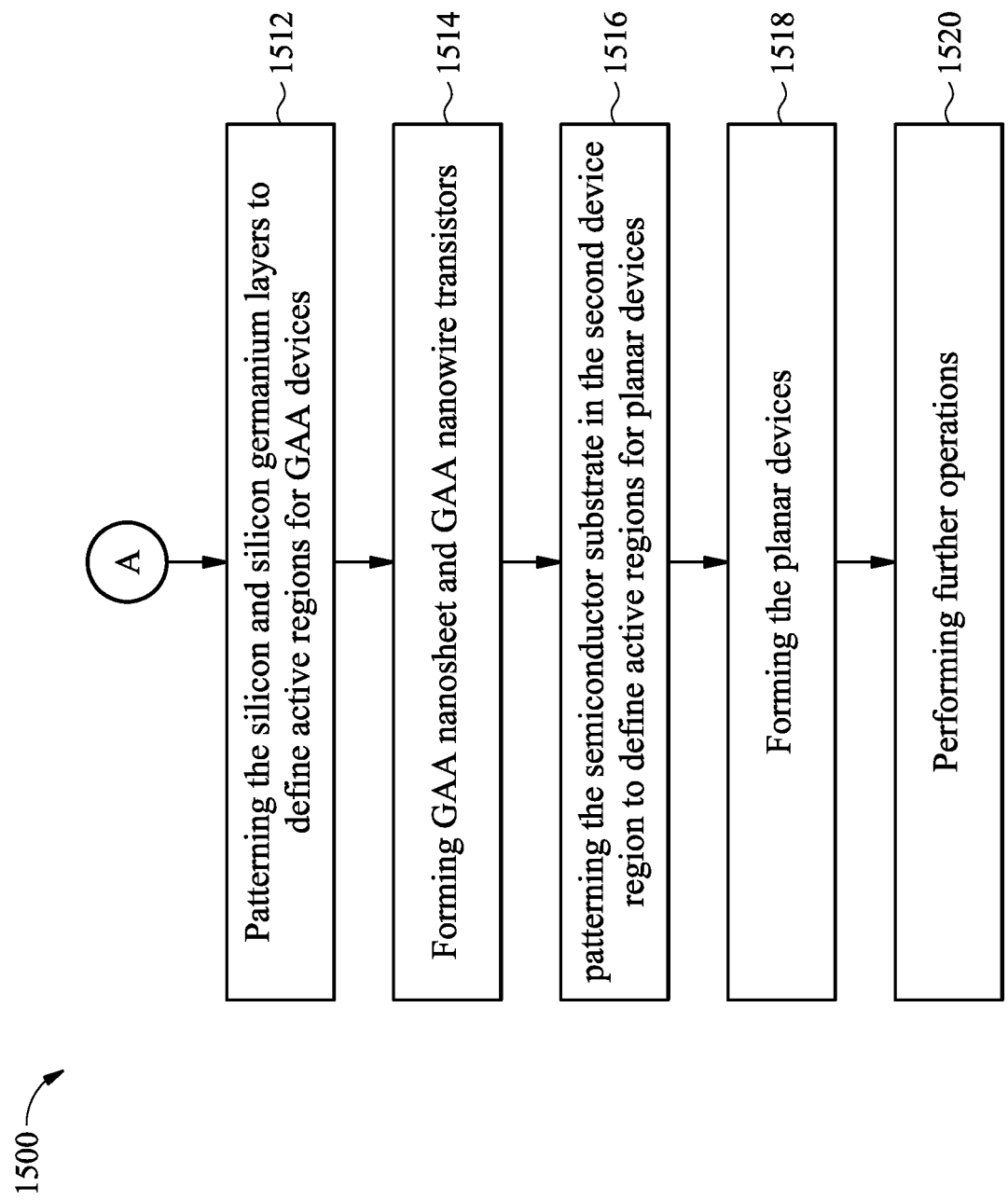

FIGS. 15A and 15B illustrate a flow chart of method 1500 for forming the semiconductor device 10 (or IC 10) in accordance with an embodiment. The method 1500 is merely an example and is not intended to limit the present disclosure beyond what is explicitly recited in the claims. Additional operations can be provided before, during, and after the method 1500, and some operations described can be replaced, eliminated, or moved around for additional embodiments of the method. The method 1500 is described below in conjunction with FIGS. 16A-16C as well as FIGS. 1-14.

At operation 1502, the method 1500 (FIG. 15A) receives a semiconductor substrate 12 having a first device region (such as an area corresponding to the device region 105) and a second device region (such as an area corresponding to the device region 107 or the device region 205 or both), as shown in FIG. 16A. The first device region 105 is for creating GAA NS and NW devices. The second device region 107 or 205 is for creating planar devices. The two device regions are separated by at least four times of a gate pitch or four times of a channel pitch planned for the GAA NS and NW devices. The semiconductor substrate 12 may a silicon wafer in an embodiment.

At operation 1504, the method 1500 (FIG. 15A) covers the second device region 107 or 205 with a mask 15 (see FIG. 16B). This may involve depositing a hard mask layer over the substrate 12, coating a photo resist layer over the hard mask layer, exposing the photo resist layer to a patterned radiation, developing the photo resist into a resist pattern, and etching the hard mask layer through the resist pattern to form the mask 15 out of the hard mask layer. Alternatively, the resist pattern itself can be the mask 15 covering the device region 107 or 205 without the need of the hard mask.

At operation 1506, the method 1500 (FIG. 15A) recesses the substrate 12 in the first device region 105 using the mask 15 as the etch mask, such as shown in FIG. 16B. The separation between the device regions 105 and the device region 107 or 205 (e.g., the separation S1 or S2 in FIGS. 1-2) provides margin for any variation of the operations 1504 and 1506.

At operation 1508, the method 1500 (FIG. 15A) epitaxially grows a stack of silicon layers 113 and silicon germanium layers 111 in the first device region 105, as illustrated in FIG. 16C. The silicon layers 113 and the silicon germanium layers 111 are alternately stacked. At operation 1510, the method 1500 (FIG. 15A) removes the mask 15. The operation 1508 may be performed before operation 1512 or after operation 1514 in some embodiments.

At operation 1512, the method 1500 (FIG. 15B) patterns the silicon layers 113 and the silicon germanium layers 111 to define active regions for the GAA NS devices and active regions for the GAA NW devices. This involves photolithography process(es) to form islands or fins in the first device region 105. Each island or fin includes the stacked silicon layers 113 and silicon germanium layers 111 and becomes an active region for the GAA NS or NW devices. The active regions may be defined according to a layout diagram shown in FIGS. 3, 4, 5, 6, and 9, or according to other layout diagrams. Space or trenches between the islands or fins are filled with an isolation structure such as STI.

At operation 1514, the method 1500 (FIG. 15B) forms GAA NS devices and GAA NW devices in the first device region 105. This may involve many process steps. The following example illustrates the process steps for forming a single GAA NS or NW device. In the example, the operation 1514 forms a dummy gate over one of the island or fin, forms outer spacers (e.g., the outer spacer 150) on sidewalls of the dummy gate, etches the island or fin not covered by the dummy gate and the outer spacers to form a recess, removes portions of the silicon germanium layer 111 exposed in the recess and directly under the outer spacers to form cavities between the silicon layers 113, fills the recess and the cavities with a dielectric material, removes the dielectric material from the recess while keeping the dielectric material in the cavities (which becomes the inner spacer 152), epitaxially grows a source/drain feature in the recess, removes the dummy gate to form a gate trench between the outer spacers, removes the silicon germanium layer 111 exposed in the gate trench (which leaves the silicon layers 113 as the channels 120 or 140), forms a gate dielectric layer (e.g., the gate dielectric layer 124 or 144) wrapping around the silicon layers 113 exposed in the gate trench, and forms a metal gate (e.g., the gate electrode 126 or 146) wrapping around the gate dielectric layer. Other process steps may be included and some of the process steps described above may be modified or substituted in various embodiments.

At operation 1516, the method 1500 (FIG. 15B) patterns the silicon substrate 12 in the second device region 107 and/or 205 to define active regions for the planar devices. This involves photolithography process(es) to form islands in the second device region 107 and/or 205. The active regions may be defined according to a layout diagram shown in FIG. 12, or according to other layout diagrams. Space or trenches between the islands are filled with an isolation structure such as STI.

At operation 1518, the method 1500 (FIG. 15B) forms the planar devices 160 and/or 220 in the second device region 107 and/or 205. This may involve multiple process steps, such as depositing a dummy gate over the active region, forming the spacers 168 or 228 (e.g., FIG. 13), forming the source/drain regions (e.g., FIG. 14), depositing an ILD layer (e.g., FIG. 14), and replacing the dummy gate with a gate electrode 166 or 226 over a gate dielectric layer 164 or 224 (e.g., FIG. 14). Thus, the method 1500 has formed GAA NS devices, GAA NW devices, and planar devices on the same substrate 12.

At operation 1520, the method 1500 (FIG. 15B) performs further steps to complete the IC 10. For example, the method 1500 may form interconnect layers that connect the GAA NS devices, the GAA NW devices, and the planar devices.

Figure 17:
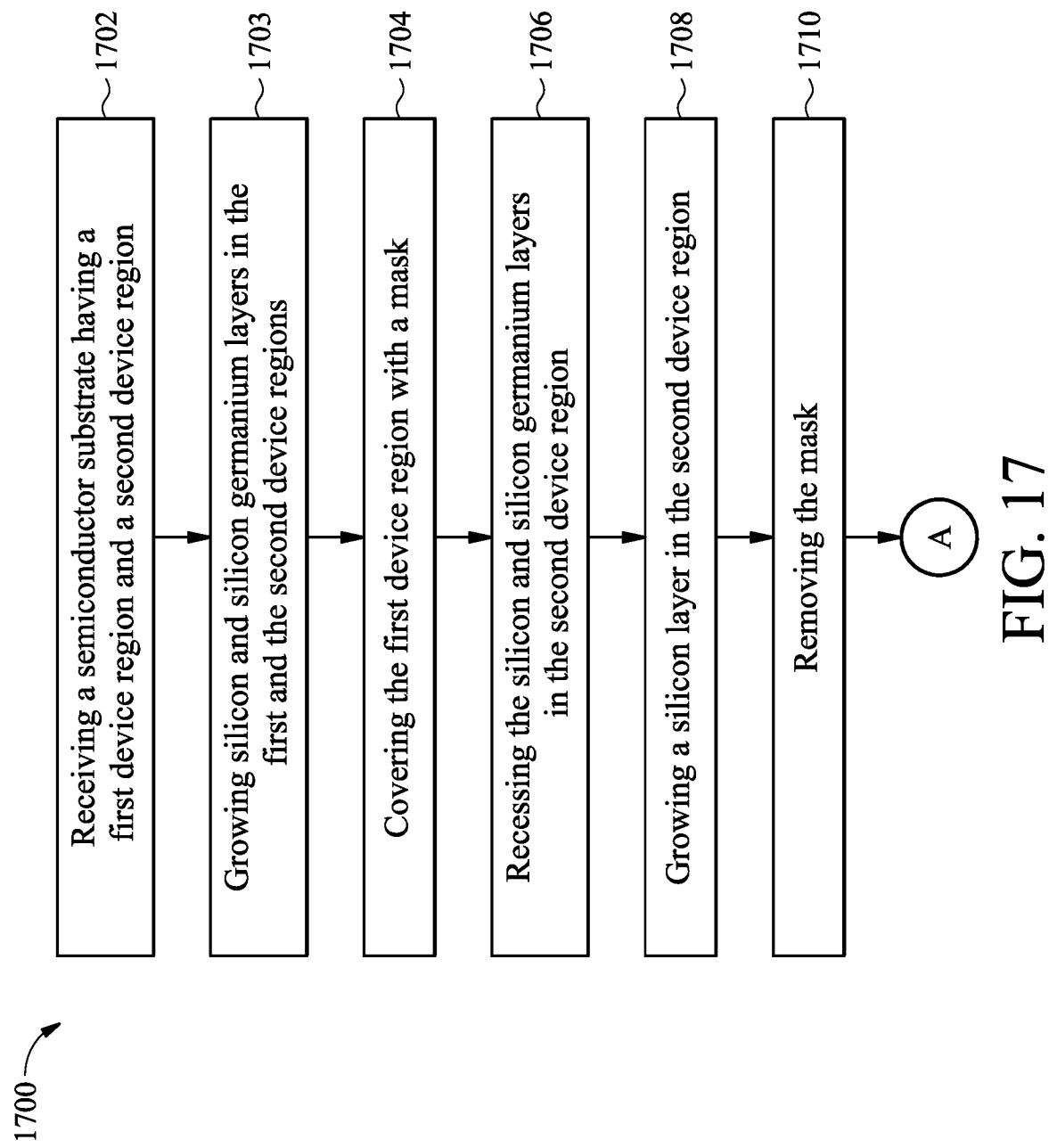
FIG. 17 shows a flow chart of another method for forming the semiconductor structure shown in FIGS. 1-2, according to aspects of the present disclosure.

FIG. 17 illustrates a flow chart of method 1700 for forming the semiconductor device 10 (or IC 10) in accordance with another embodiment. The method 1700 is merely an example and is not intended to limit the present disclosure beyond what is explicitly recited in the claims. Additional operations can be provided before, during, and after the method 1700, and some operations described can be replaced, eliminated, or moved around for additional embodiments of the method. The method 1700 is described below in conjunction with FIGS. 18A-18D as well as FIGS. 1-14.

Figure 18A:
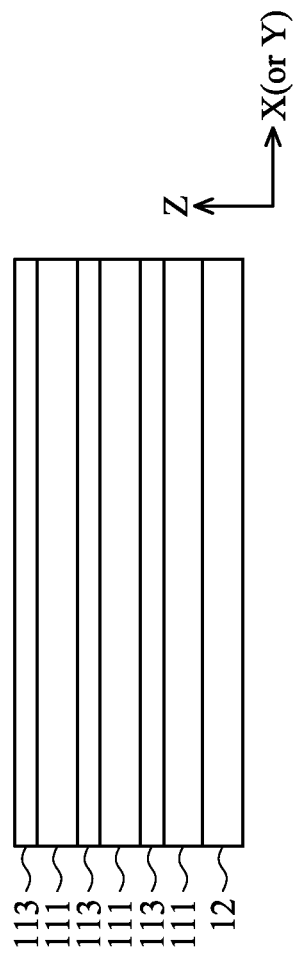
FIGS. 18A, 18B, 18C, and 18D illustrate top and cross-sectional views of the semiconductor structure during some fabrication steps of the method of FIG. 17.

At operation 1702, the method 1700 (FIG. 17) receives a semiconductor substrate 12 having a first device region (such as an area corresponding to the device region 105) and a second device region (such as an area corresponding to the device region 107 or the device region 205 or both), as shown in FIG. 18A. This step is the same as the operation 1502 discussed above.

Figure 18B:
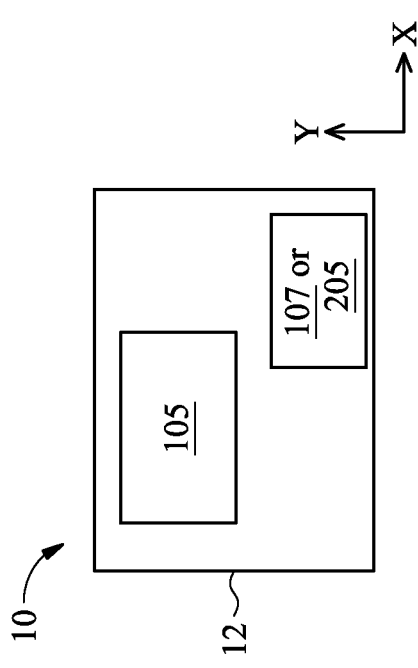

At operation 1703, the method 1700 (FIG. 17) grows a stack of silicon layers 113 and silicon germanium layers 111 over the substrate 12, such as shown in FIG. 18B. The silicon layers 113 and the silicon germanium layers 111 are alternately stacked.

Figure 18C:
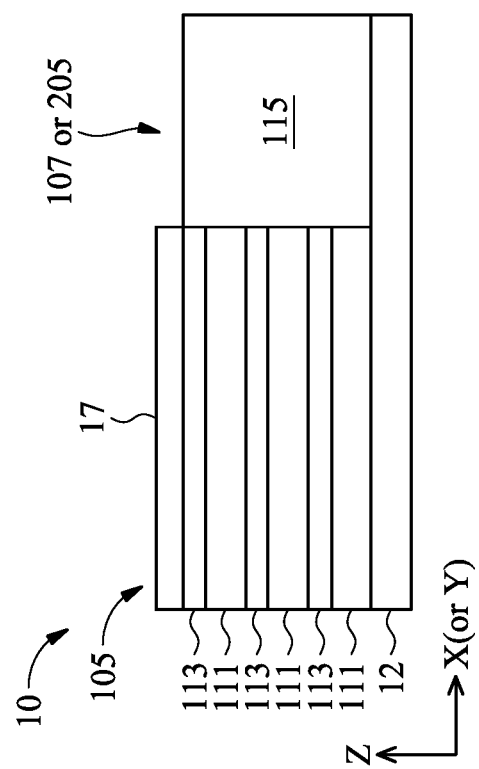

At operation 1704, the method 1700 (FIG. 17) covers the first device region 105 with a mask 17 (see FIG. 18C). This operation is similar to the operation 1504, except that the mask 17 is disposed directly above the first device region 105 while the mask 15 is disposed directly above the second device region 107 or 205 in the operation 1504.

At operation 1706, the method 1700 (FIG. 17) recesses the silicon layers 113 and the silicon germanium layers 111 in the second device region 107 or 205 using the mask 17 as the etch mask, such as shown in FIG. 18C. The separation between the device regions 105 and the device region 107 or 205 (e.g., the separation S1 or S2 in FIGS. 1-2) provides margin for any variation of the operations 1704 and 1706.

Figure 18D:
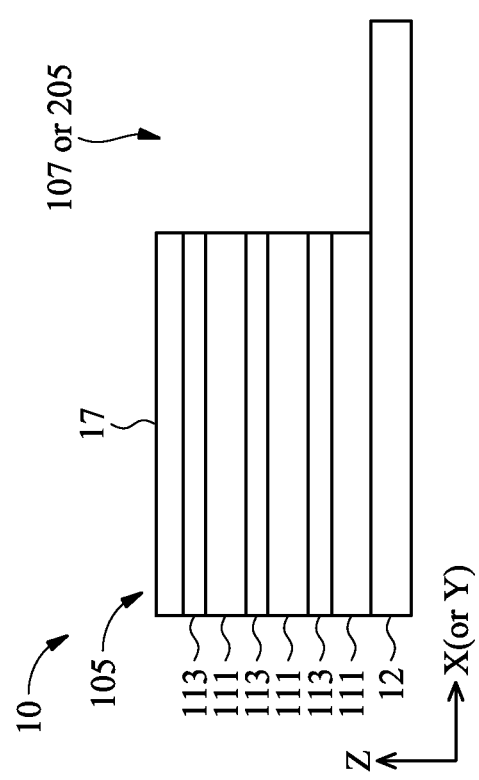

At operation 1708, the method 1700 (FIG. 17) epitaxially grows a silicon layer 115 over the substrate 12 in the second device region 107 or 205, as shown in FIG. 18D.

At operation 1710, the method 1700 (FIG. 17) removes the mask 17, and proceeds to the operations shown in FIG. 15B, which have been discussed above. Alternatively, the mask 17 can be removed after the silicon layer 115 in the second device region is patterned and before the silicon layers 113 and the silicon germanium layers 111 are patterned.

Although not intended to be limiting, one or more embodiments of the present disclosure provide many benefits to a semiconductor device and the formation thereof. For example, embodiments of the present disclosure provide high performance GAA NS devices, low leakage GAA NW devices, and planar devices on the same substrate and in the same integrated circuit. The GAA NS devices and the GAA NW devices are placed in a core area of the IC, for example, for high-speed or low-power circuits, while the planar devices are placed in an I/O area of the IC for implementing I/O circuits, ESD circuits, BJT, resistors, capacitors, diodes, or other circuits. The planar devices can also be placed in the core area of the IC for implementing BJT, resistors, capacitors, diodes, or other circuits. The GAA NS devices, the GAA NW devices, and the core-area planar devices have about the same gate dielectric thickness, and the I/O-area planar devices have a larger gate dielectric thickness. Further, the channel width of the GAA NS devices is sufficiently larger than the channel width of the GAA NW devices to create performance differences in the two types of the devices. The present embodiments enable circuit designers to optimize the circuits in different areas of the IC by choosing different types of devices.

In one aspect, the present disclosure is directed to an integrated circuit. The integrated circuit includes a substrate, and gate-all-around (GAA) nanowire transistors, GAA nanosheet transistors, and a first planar device on the substrate. Each GAA nanowire transistor has vertically stacked multiple nanowire channels, a first gate dielectric layer wrapping around the nanowire channels, and a first gate electrode wrapping around the first gate dielectric layer. Each GAA nanosheet transistor has vertically stacked multiple nanosheet channels, a second gate dielectric layer wrapping around the nanosheet channels, and a second gate electrode wrapping around the second gate dielectric layer. The first planar device has a first planar channel, a third dielectric layer over the first planar channel, and a third electrode over the third dielectric layer. The first and the second gate dielectric layers have substantially a same thickness. The third dielectric layer is thicker than both the first and the second gate dielectric layers. A first width of the nanowire channels is smaller than a second width of the nanosheet channels. The second width is smaller than a third width of the first planar channel. The GAA nanowire transistors and the GAA nanosheet transistors are adjacent to each other in a core area of the integrated circuit. The first planar device is in an I/O area of the integrated circuit separate from the core area.

In an embodiment of the integrated circuit, a ratio of the second width to the first width is in a range of 1.3 to 10. In an embodiment, the first width is equal to or less than 20 nm, the second width is equal to or less than 60 nm, and the third width is greater than 60 nm.

In an embodiment of the integrated circuit, each of the GAA nanowire transistors and the GAA nanosheet transistors has a gate length less than 20 nm and the first planar device has a gate length greater than 50 nm. In an embodiment, each of the first and the second gate dielectric layers has a thickness less than 2.5 nm, and the third dielectric layer has a thickness greater than 3 nm. In an embodiment, each of the nanowire channels and the nanosheet channels has a thickness in a range of 3 nm to 8 nm, the first width is in a range of 4 nm to 11 nm, the second width is in a range of 12 nm to 40 nm, and the third width is in a range of 60 nm to 3,000 nm.

In an embodiment, the integrated circuit further includes a second planar device in the core area. The second planar device has a second planar channel, a fourth dielectric layer over the second planar channel, and a fourth electrode over the fourth dielectric layer. The first, the second, and the fourth dielectric layers have substantially a same thickness. The second planar device is away from the GAA nanosheet transistors and the GAA nanowire transistors by at least four times a gate pitch of the GAA nanosheet transistors or the GAA nanowire transistors or by at least four times a channel pitch of the GAA nanosheet transistors or the GAA nanowire transistors. In a further embodiment, a fourth width of the second planar channel is greater than the second width, and a gate length of the second planar device is at least twice of a gate length of the GAA nanowire transistors or the GAA nanosheet transistors. In a further embodiment, the fourth width is in a range of 60 nm to 3,000 nm.

In another aspect, the present disclosure is directed to a method. The method includes receiving a semiconductor substrate having a first device region and a second device region separate from the first device region; and forming a mask covering the second device region. While the mask covers the second device region, the method further includes recessing the semiconductor substrate in the first device region; and after the recessing, epitaxially growing multiple silicon and silicon germanium layers alternately stacked in the first device region. The method further includes patterning the silicon and silicon germanium layers in the first device region to define first active regions for gate-all-around (GAA) nanowire transistors and second active regions for GAA nanosheet transistors; and patterning the semiconductor substrate in the second device region to define third active regions for planar devices, wherein a first width of the first active regions is smaller than a second width of the second active regions, and the second width is smaller than a third width of the third active regions.

In an embodiment of the method, a distance between the first and the second device regions is at least four times a pitch of the first active regions. In another embodiment, the first width is equal to or less than 20 nm, the second width is equal to or less than 60 nm, and a ratio of the second width to the first width is in a range of 1.3 to 10.

In an embodiment, the method further includes forming the GAA nanowire transistors using the first active regions; forming the GAA nanosheet transistors using the second active regions; and forming the planar devices using the third active regions. In a further embodiment, the forming of the GAA nanowire transistors and the forming of the GAA nanosheet transistors includes depositing a high-k gate dielectric layer having substantially a same thickness (a first thickness) for the GAA nanowire transistors and the GAA nanosheet transistors, and wherein the forming of the planar devices includes depositing a gate dielectric layer having a second thickness greater than the first thickness. In a further embodiment, the forming of the GAA nanowire transistors, the forming of the GAA nanosheet transistors, and the forming of the planar devices includes depositing a gate dielectric layer having substantially a same thickness for the GAA nanowire transistors, the GAA nanosheet transistors, and the planar devices.

In yet another aspect, the present disclosure is directed to a method. The method includes receiving a semiconductor substrate having a first device region and a second device region separate from the first device region; epitaxially growing multiple silicon and silicon germanium layers alternately stacked in the first and the second device regions; and forming a mask covering the first device region. While the mask covers the first device region, the method includes recessing the silicon and silicon germanium layers in the second device region; and after the recessing, epitaxially growing a silicon layer in the second device region. The method further includes patterning the silicon and silicon germanium layers in the first device region to define first active regions for gate-all-around (GAA) nanowire transistors and second active regions for GAA nanosheet transistors; and patterning the silicon layer in the second device region to define third active regions for planar devices, wherein a first width of the first active regions is smaller than a second width of the second active regions that is smaller than a third width of the third active regions.

In an embodiment, the method further includes removing the mask after the patterning of the silicon layer in the second device region. In an embodiment of the method, the first width is equal to or less than 20 nm, the second width is equal to or less than 60 nm, a ratio of the second width to the first width is in a range of 1.3 to 10, and the third width is in a range of 60 nm to 3,000 nm.

In another embodiment, the method further includes forming the GAA nanowire transistors using the first active regions; forming the GAA nanosheet transistors using the second active regions; and forming the planar devices using the third active regions. In a further embodiment, the GAA nanowire transistors and the GAA nanosheet transistors are formed to have a same gate dielectric layer, and the planar devices are formed to have a thicker gate dielectric layer than the GAA nanowire transistors and the GAA nanosheet transistors.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a substrate;
first gate-all-around (GAA) transistors on the substrate, wherein each first GAA transistor includes vertically stacked multiple first channels, a first gate dielectric layer wrapping around the first channels, and a first gate electrode wrapping around the first gate dielectric layer; and
a first planar transistor on the substrate, wherein the first planar transistor includes a second channel, a second gate dielectric layer over the second channel, and a second gate electrode over the second gate dielectric layer,
wherein the second gate dielectric layer is thicker than the first gate dielectric layers, and a first width of the first channels is smaller than a second width of the second channel.

2. The integrated circuit of claim 1, further comprising second GAA transistors, wherein each second GAA transistor includes vertically stacked multiple third channels, a third gate dielectric layer wrapping around the third channels, and a third gate electrode wrapping around the third gate dielectric layer, wherein a third width of the third channels is greater than the first width, and the first and the third gate dielectric layers have about same thickness.

3. The integrated circuit of claim 2, wherein the first and the second GAA transistors are in a core area of the integrated circuit, and the first planar transistor is in an I/O area of the integrated circuit separate from the core area.

4. The integrated circuit of claim 2, wherein a ratio of the third width to the first width is in a range of 1.3 to 10.

5. The integrated circuit of claim 1, wherein each of the first GAA transistors has a gate length less than 20 nm and the first planar transistor has a gate length greater than 50 nm.

6. The integrated circuit of claim 1, further comprising a second planar transistor, wherein the second planar transistor and the first GAA transistors are in a core area of the integrated circuit, and the first planar transistor is in an I/O area of the integrated circuit separate from the core area.

7. The integrated circuit of claim 6, wherein the second planar transistor includes a third channel, a third gate dielectric layer over the third channel, and a third gate electrode over the third gate dielectric layer, wherein the first and the third gate dielectric layers have substantially a same thickness, wherein the second planar transistor is away from the first GAA transistors by at least four times a gate pitch of the first GAA transistors.

8. An integrated circuit, comprising:
a substrate;

gate-all-around (GAA) nanowire transistors on the substrate, each GAA nanowire transistor having vertically stacked multiple nanowire channels, a first gate dielectric layer wrapping around the nanowire channels, and a first gate electrode wrapping around the first gate dielectric layer; and GAA nanosheet transistors on the substrate, each GAA nanosheet transistor having vertically stacked multiple nanosheet channels, a second gate dielectric layer wrapping around the nanosheet channels, and a second gate electrode wrapping around the second gate dielectric layer; and a first planar transistor on the substrate, the first planar transistor having a third channel, a third gate dielectric layer over the third channel, and a third gate electrode over the third gate dielectric layer, wherein the first and the second gate dielectric layers have substantially a same thickness, and the third gate dielectric layer is thicker than both the first and the second gate dielectric layers, wherein a first width of the nanowire channels is smaller than a second width of the nanosheet channels, and the second width is smaller than a third width of the third channel, and wherein the GAA nanowire transistors and the GAA nanosheet transistors are adjacent to each other in a core area of the integrated circuit, and the first planar transistor is in an I/O area of the integrated circuit separate from the core area.

9. The integrated circuit of claim 8, wherein a ratio of the second width to the first width is in a range of 1.3 to 10.

10. The integrated circuit of claim 8, wherein the first width is equal to or less than 20 nm, the second width is equal to or less than 60 nm, and the third width is greater than 60 nm.

11. The integrated circuit of claim 8, wherein each of the GAA nanowire transistors and the GAA nanosheet transistors has a gate length less than 20 nm and the first planar transistor has a gate length greater than 50 nm.

12. The integrated circuit of claim 8, wherein each of the first and the second gate dielectric layers has a thickness less than 2.5 nm, and the third gate dielectric layer has a thickness greater than 3 nm.

13. The integrated circuit of claim 8, wherein each of the nanowire channels and the nanosheet channels has a thickness in a range of 3 nm to 8 nm, the first width is in a range of 4 nm to 11 nm, the second width is in a range of 12 nm to 40 nm, and the third width is in a range of 60 nm to 3,000 nm.

14. The integrated circuit of claim 8, further comprising a second planar transistor in the core area, the second planar transistor having a fourth channel, a fourth gate dielectric layer over the fourth channel, and a fourth gate electrode over the fourth gate dielectric layer, wherein the first, the second, and the fourth gate dielectric layers have substantially a same thickness, wherein the second planar transistor is away from the GAA nanosheet transistors and the GAA nanowire transistors by at least four times a gate pitch of the GAA nanosheet transistors, at least four times a gate pitch of the GAA nanowire transistors, at least four times a channel pitch of the GAA nanosheet transistors, or at least four times a channel pitch of the GAA nanowire transistors.

15. The integrated circuit of claim 14, wherein a fourth width of the fourth channel is greater than the second width, and a gate length of the second planar transistor is at least twice of a gate length of the GAA nanowire transistors or the GAA nano sheet transistors.

16. The integrated circuit of claim 15, wherein the fourth width is in a range of 60 nm to 3,000 nm.

17. An integrated circuit, comprising:
a substrate;
first gate-all-around (GAA) transistors on the substrate, each first GAA transistor having vertically stacked multiple first channels, a first gate dielectric layer wrapping around the first channels, and a first gate electrode wrapping around the first gate dielectric layer;
second GAA transistors on the substrate, each second GAA transistor having vertically stacked multiple second channels, a second gate dielectric layer wrapping around the second channels, and a second gate electrode wrapping around the second gate dielectric layer; and
a first planar transistor on the substrate, the first planar transistor having a third channel, a third gate dielectric layer over the third channel, and a third gate electrode over the third gate dielectric layer,
wherein the first and the second gate dielectric layers have substantially a same thickness, and the third gate dielectric layer is thicker than both the first and the second gate dielectric layers, wherein a first width of the first channels is smaller than a second width of the second channels, and the second width is smaller than a third width of the third channel.

18. The integrated circuit of claim 17, wherein the first and the second GAA transistors are in a core area of the integrated circuit, and the first planar transistor is in an I/O area of the integrated circuit separate from the core area.

19. The integrated circuit of claim 18, further comprising a second planar transistor in the core area, the second planar transistor having a fourth channel, a fourth gate dielectric layer over the fourth channel, and a fourth gate electrode over the fourth gate dielectric layer, wherein the first, the second, and the fourth gate dielectric layers have substantially a same thickness.

20. The integrated circuit of claim 19, wherein the second planar transistor is away from the first and the second GAA transistors by at least four times a gate pitch of the first GAA transistors, at least four times a gate pitch of the second GAA transistors, at least four times a channel pitch of the first GAA transistors, or at least four times a channel pitch of the second GAA transistors.

* * * * *